United States Patent
Oi et al.

(10) Patent No.: US 8,138,018 B2
(45) Date of Patent: Mar. 20, 2012

(54) MANUFACTURING METHOD OF SEMICONDUCTOR DEVICE HAVING UNDERFILL RESIN FORMED WITHOUT VOID BETWEEN SEMICONDUCTOR CHIP AND WIRING BOARD

(75) Inventors: Kiyoshi Oi, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 375 days.

(21) Appl. No.: 12/418,637

(22) Filed: Apr. 6, 2009

(65) Prior Publication Data
US 2009/0258460 A1 Oct. 15, 2009

(30) Foreign Application Priority Data
Apr. 15, 2008 (JP) ................................ 2008-105314

(51) Int. Cl.
*H01L 21/00* (2006.01)
(52) U.S. Cl. ........ 438/108; 438/106; 257/737; 257/778; 257/E21.503; 257/E21.511
(58) Field of Classification Search ................. 438/108, 438/106; 257/778, E21.503, E21.511, 737
See application file for complete search history.

(56) References Cited

U.S. PATENT DOCUMENTS

| | | | |
|---|---|---|---|
| 6,260,264 B1* | 7/2001 | Chen et al. ...................... | 29/832 |
| 2006/0099737 A1* | 5/2006 | Ohuchi ......................... | 438/108 |
| 2008/0265438 A1* | 10/2008 | Asano ........................... | 257/778 |
| 2009/0001571 A1* | 1/2009 | Mizuno et al. ................. | 257/737 |

FOREIGN PATENT DOCUMENTS
JP 2002-121358 A 4/2002
* cited by examiner

*Primary Examiner* — A. Sefer
*Assistant Examiner* — Farid Khan
(74) *Attorney, Agent, or Firm* — IPUSA, PLLC

(57) ABSTRACT

A manufacturing method of a semiconductor device includes a film state underfill resin adhering step wherein film state underfill resin in a semi-cured state is adhered on the first surface of the board main body without forming a gap between the first surface of the board main body and the pad; a flattening step wherein an upper surface of the film state underfill resin is flattened; a chip connecting step wherein the semiconductor chip is pressed onto the upper surface of the film state underfill resin after the flattening step so that the semiconductor chip is flip chip connected to the pad; and an underfill resin forming step wherein the film state underfill resin is cured so that the underfill resin is formed between the semiconductor chip and the wiring board.

5 Claims, 29 Drawing Sheets

MANUFACTURING METHOD OF SEMICONDUCTOR DEVICE HAVING UNDERFILL RESIN FORMED WITHOUT VOID BETWEEN SEMICONDUCTOR CHIP AND WIRING BOARD

CROSS-REFERENCE TO RELATED APPLICATIONS

This patent application is based upon and claims the benefit of priority of Japanese Patent Application No. 2008-105314 filed on Apr. 15, 2008, the entire contents of which are incorporated herein by reference.

BACKGROUND OF THE INVENTION

1. Field of the Invention

The present invention generally relates to manufacturing methods of semiconductor devices. More specifically, the present invention relates to a manufacturing method of a semiconductor device, the semiconductor device including a wiring board where a semiconductor chip is flip chip connected and underfill resin configured to seal the semiconductor chip and the wiring board.

2. Description of the Related Art

FIG. 1 is a cross-sectional view of a related art semiconductor device. In FIG. 1, "J" (hereinafter "gap J") indicates a gap between a semiconductor chip 202 and a wiring board main body 211.

As shown in FIG. 1, a related art semiconductor device 200 includes a wiring board 201, the semiconductor chip 202, and underfill resin 203. The wiring board 201 includes the board main body 211 pads 212, solders 213, and a solder resist layer 214.

The board main body 211 includes plural stacked insulation layers (not shown in FIG. 1), wiring patterns (not shown in FIG. 1), and outside connection pads (not shown in FIG. 1). The wiring patterns are provided in plural insulation layers and electrically connected to the pads 212. The outside connection pads are provided on a rear surface 211B of the board main body 211 and configured to be electrically connected to the wiring patterns.

The pads 212 are provided on a front surface 211A of the board main body 211. The semiconductor chip 202 is flip chip connected to the pads 212.

The solders 213 are provided on upper surfaces 212A of the pads 212. The solders 213 are configured to fix bumps 204 on the pads 212. The bumps 204 are connected to electrodes pads 216 of the semiconductor chip 202.

The solder resist layer 214 is provided on the front surface 211A of the board main body 211 so as to surround an area where the pads 212 are formed. The semiconductor chip 202 includes the electrode pads 216. The bumps 204 are provided on the electrode pads 216. The semiconductor chip 202 is flip chip connected to the pads 212 so as to be electrically connected to the wiring board 201 via the bumps 204.

FIG. 2 through FIG. 5 show a manufacturing process of the related art semiconductor device. In FIG. 2 through FIG. 5, parts that are the same as the parts of the related art semiconductor device 200 shown in FIG. 1 are given the same reference numerals, and explanation thereof is omitted.

A manufacturing method of the related art semiconductor device 200 is discussed with reference to FIG. 2 through FIG. 5. First, in a step shown in FIG. 2, the wiring board 201 is formed by a known method. Next, in a step shown in FIG. 3, the semiconductor chip 202 is flip chip connected on the pads 212 where the solders 213 are formed.

After that, in a step shown in FIG. 4, liquid state underfill resin 221 supplied from a dispenser 219 is led into a gap between the semiconductor chip 202 and the wiring board 201 by capillarity. As a result of this, the liquid state underfill resin 221 is formed between the semiconductor chip 202 and the wiring board 201.

Next, in a step shown in FIG. 5, the liquid state underfill resin 221 shown in FIG. 4 is cured so that the underfill resin 203 is formed between the semiconductor chip 202 and the wiring board 201. As a result of this, the related art semiconductor device 200 is formed.

In the above-discussed manufacturing method of the semiconductor device 200, a case is explained where the liquid state underfill resin 221 is formed between the semiconductor chip 202 and the wiring board 201 after the semiconductor chip 202 is flip chip connected. However, as shown in FIG. 6 and FIG. 7, the liquid state underfill resin 221 may be formed on the wiring board 201 before the semiconductor chip 202 is flip chip connected on the pads 212.

FIG. 6 and FIG. 7 are views showing another manufacturing process of the related art semiconductor device. In FIG. 6 and FIG. 7, parts that are the same as the parts of the related art semiconductor device 200 shown in FIG. 1 are given the same reference numerals, and explanation thereof is omitted.

Another manufacturing method of the related art semiconductor device 200 is discussed with reference to FIG. 6 and FIG. 7. First, in a step shown in FIG. 6, the liquid state underfill resin 221 is applied on the above-discussed wiring board 201 shown in FIG. 2. Next, in a step shown in FIG. 7, the semiconductor chip 202 is pushed onto the liquid state underfill resin 221 so that the semiconductor chip 202 is flip chip connected to the pads 212. After that, by performing the same step as that shown in FIG. 5, the related art semiconductor device 200 is manufactured. See, for example, Japanese Laid-Open Patent Application Publication No. 2002-121358.

FIG. 8 is a view for explaining problems of the manufacturing process of the related art semiconductor device. FIG. 9 is a view for explaining problems of another manufacturing process of the related art semiconductor device. In FIG. 8 and FIG. 9, parts that are the same as the parts of the related art semiconductor device 200 shown in FIG. 1 are given the same reference numerals, and explanation thereof is omitted.

In the manufacturing method of the related art semiconductor device 200 (see FIG. 2 through FIG. 5), for example, when a gap J between the semiconductor chip 202 and the board main body 211 is narrow (for example, when the gap J is equal to or less than 35 μm) or when the size of the semiconductor chip 202 is large (for example, a length of one side of the semiconductor chip 202 is equal to or greater than 10 mm), a void 224 shown in FIG. 8 may be formed in the underfill resin 203 due to a short shot of the liquid state underfill resin 221. As a result of this, reliability of electric connections between the semiconductor chip 202 and the wiring board 201 is degraded so that the yield of manufacturing the semiconductor device 200 may be decreased.

In addition, in another manufacturing method of the related art semiconductor device 200 (see FIG. 9), air bubbles may be formed inside the liquid state underfill resin 221 in the step of applying the liquid state underfill resin 221 or the step of flip chip connecting the semiconductor chip 202 by pushing the semiconductor chip 202 onto the liquid state underfill resin 221. As a result of this, voids 225 or 226 shown in FIG. 9 may be formed in the underfill resin 203 and thereby the yield of manufacturing the semiconductor device 200 may be decreased.

SUMMARY OF THE INVENTION

Accordingly, embodiments of the present invention may provide a novel and useful manufacturing method of a semiconductor device solving one or more of the problems discussed above.

More specifically, the embodiments of the present invention may provide a manufacturing method of a semiconductor device whereby generation of voids is prevented so that yield of the semiconductor devices can be improved.

One aspect of the present invention may be to provide a manufacturing method of a semiconductor device, the semiconductor device including,
  a semiconductor chip;
  a wiring board including a board main body and a pad provided on a first surface of the board main body, the pad being located where the semiconductor chip is flip chip connected; and
  underfill resin configured to seal between the semiconductor chip and the wiring board,
  the method including:
  a film state underfill resin adhering step wherein film state underfill resin in a semi-cured state is adhered on the first surface of the board main body without forming a gap between the first surface of the board main body and the pad;
  a flattening step wherein an upper surface of the film state underfill resin is flattened;
  a chip connecting step wherein the semiconductor chip is pressed onto the upper surface of the film state underfill resin after the flattening step so that the semiconductor chip is flip chip connected to the pad; and
  an underfill resin forming step wherein the film state underfill resin is cured so that the underfill resin is formed between the semiconductor chip and the wiring board.

Another aspect of the present invention may be to provide a manufacturing method of a semiconductor device, the semiconductor device including,
  a semiconductor chip;
  a wiring board including a board main body and a pad provided on a first surface of the board main body, the pad being located where the semiconductor chip is flip chip connected; and
  underfill resin configured to seal between the semiconductor chip and the wiring board,
  the method including:
  a film state underfill resin adhering step wherein film state underfill resin in a semi-cured state is adhered on the first surface of the board main body without forming a gap between the first surface of the board main body and the pad;
  a flattening step wherein an upper surface of the film state underfill resin is flattened;
  an underfill resin base material forming step wherein another film state underfill resin in a semi-cured state or a liquid state underfill resin is formed on an upper surface of the film state underfill resin after the flattening step, so that underfill resin base material, made of the film state underfill resin and the other film state underfill resin or the film state underfill resin and the liquid state underfill resin, is formed;
  a chip connecting step wherein the semiconductor chip is pressed onto the upper surface of the underfill resin base material so that the semiconductor chip is flip chip connected to the pad; and
  an underfill resin forming step wherein the underfill resin base material is cured so that the underfill resin is formed between the semiconductor chip and the wiring board.

Another aspect of the present invention may be to provide a manufacturing method of a semiconductor device, the semiconductor device including,
  a semiconductor chip;
  a wiring board including a board main body and a pad provided on a first surface of the board main body, the pad being located where the semiconductor chip is flip chip connected; and
  underfill resin configured to seal between the semiconductor chip and the wiring board,
  the method comprising:
  a film state underfill resin adhering step wherein film state underfill resin in a semi-cured state is adhered on the first surface of the board main body without forming a gap between the first surface of the board main body and the pad;
  an underfill resin base material forming step wherein another film state underfill resin in a semi-cured state or a liquid state underfill resin is formed on an upper surface of the film state underfill resin after the film state underfill resin adhering step, so that underfill resin base material, made of the film state underfill resin and the other film state underfill resin or the film state underfill resin and the liquid state underfill resin, is formed;
  a chip connecting step wherein the semiconductor chip is pressed onto the upper surface of the underfill resin base material so that the semiconductor chip is flip chip connected to the pad; and
  an underfill resin forming step wherein the underfill resin base material is cured so that the underfill resin is formed between the semiconductor chip and the wiring board.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 10 through FIG. 29 of embodiments of the present invention.

Figure 1:
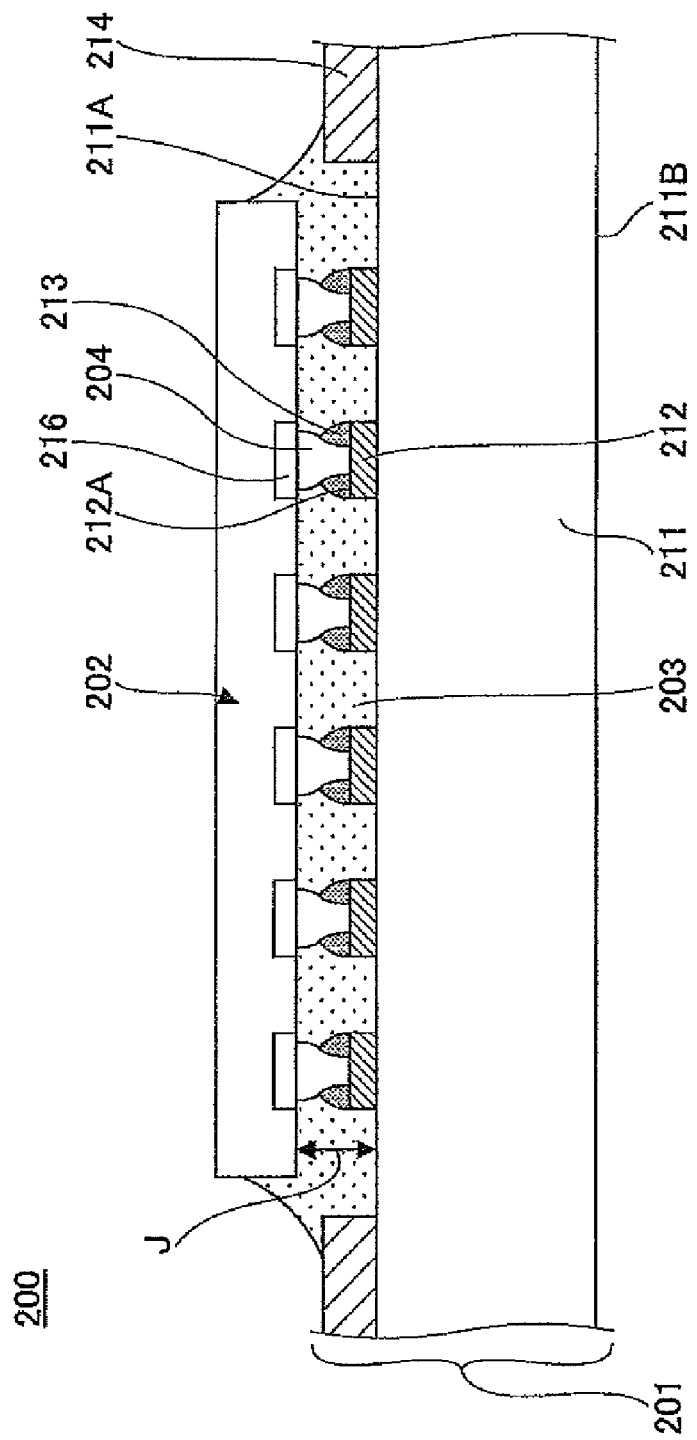
FIG. 1 is a cross-sectional view of a related art semiconductor device.
Figure 2:
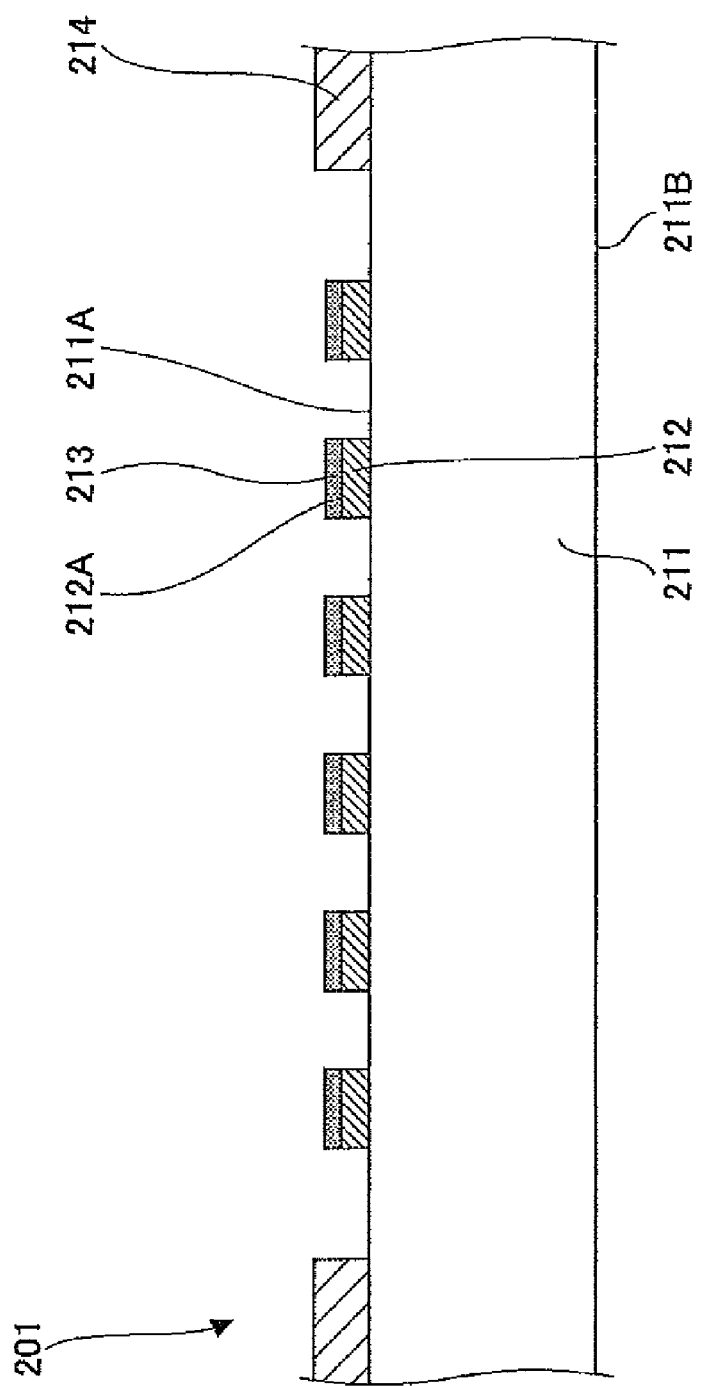
FIG. 2 is a first view showing a manufacturing process of the related art semiconductor device.
Figure 3:
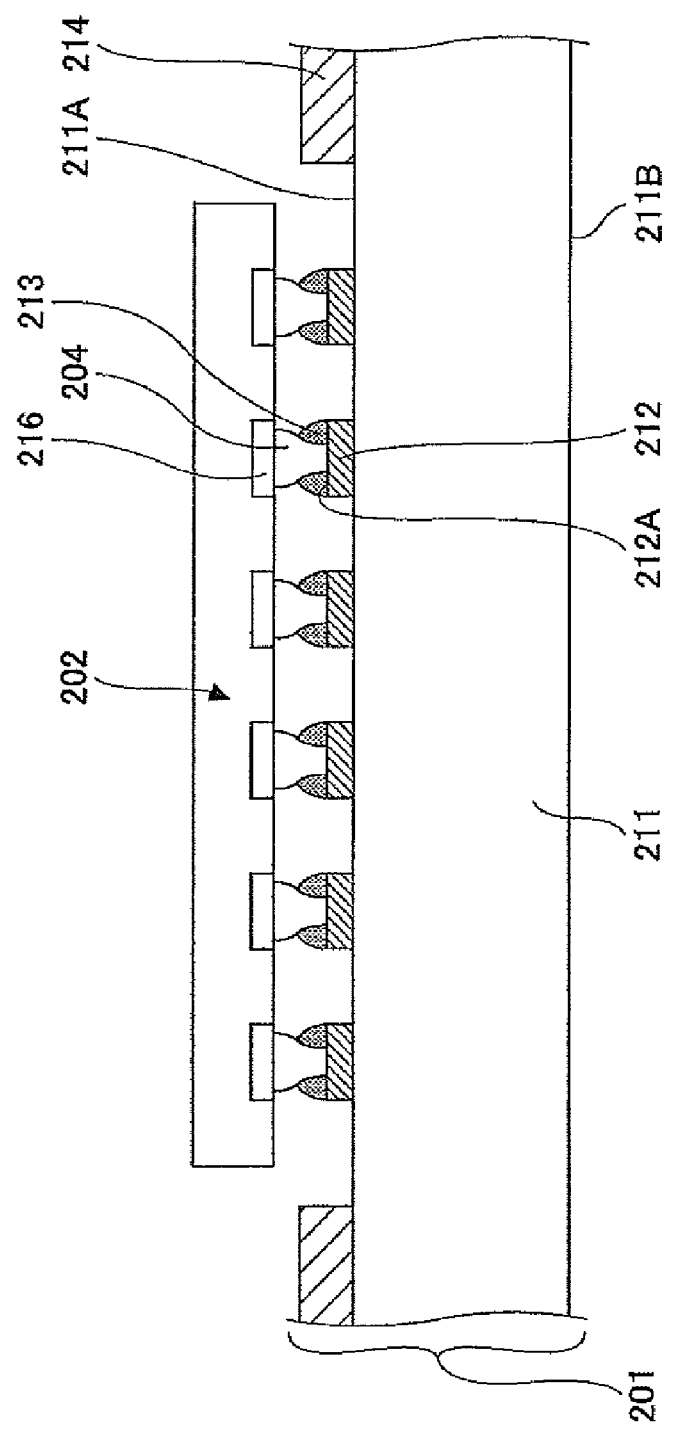
FIG. 3 is a second view showing the manufacturing process of the related art semiconductor device.
Figure 4:
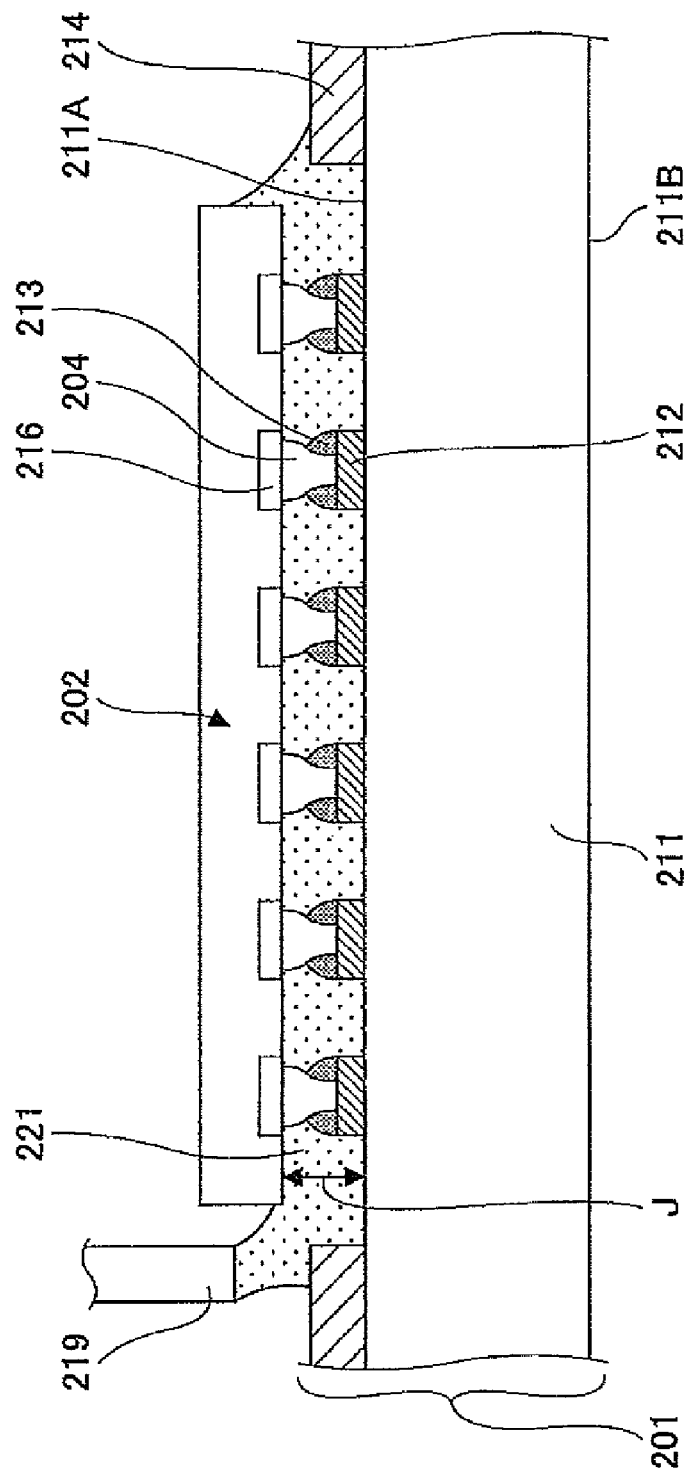
FIG. 4 is a third view showing the manufacturing process of the related art semiconductor device.
Figure 5:
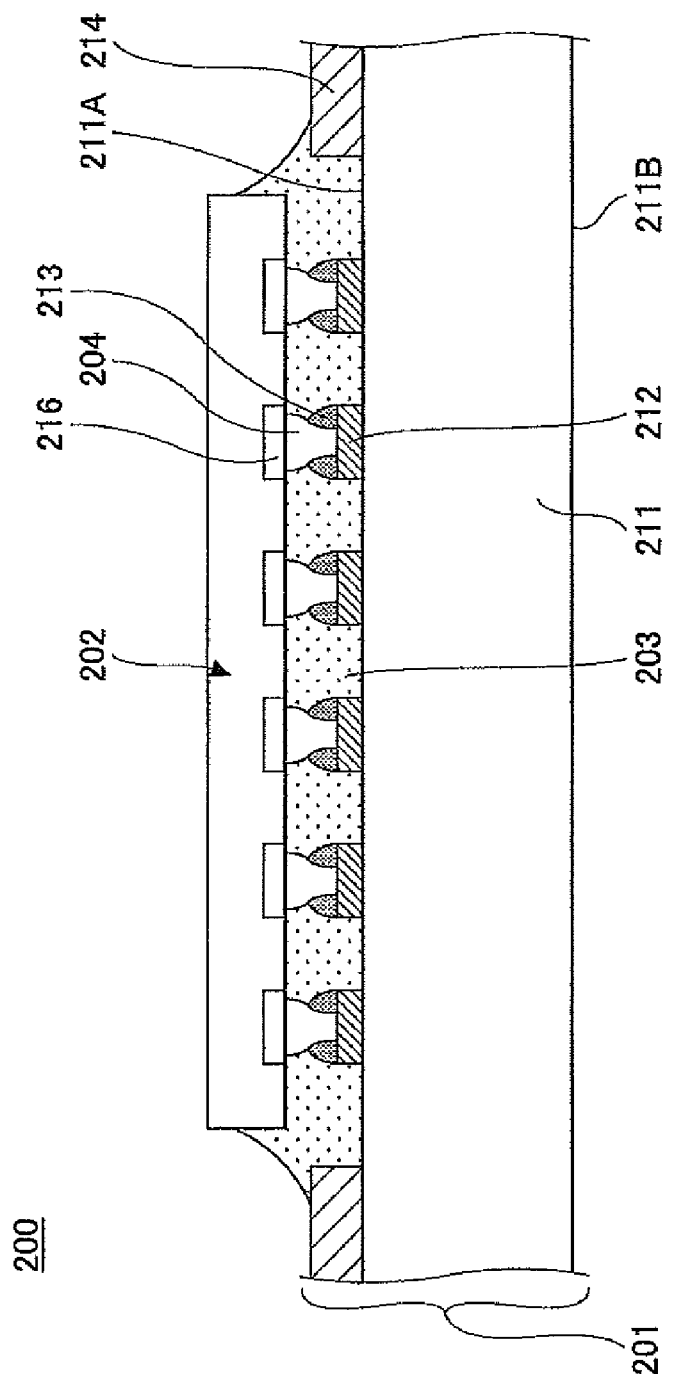
FIG. 5 is a fourth view showing the manufacturing process of the related art semiconductor device.
Figure 6:
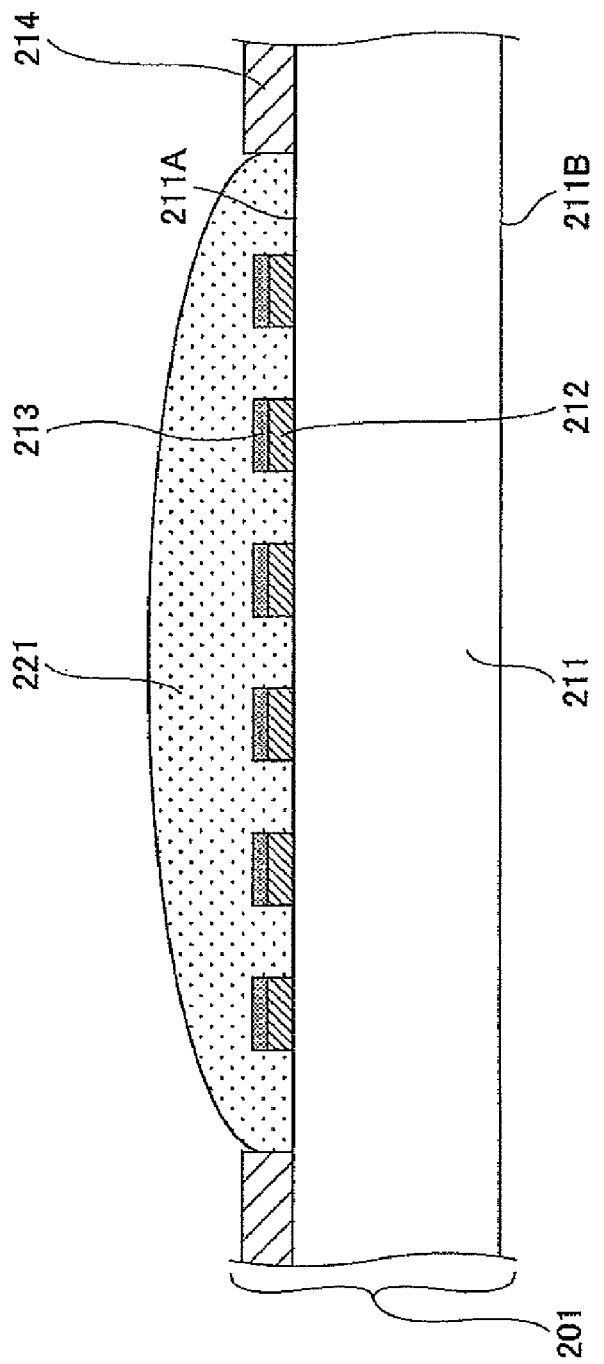
FIG. 6 is a first view showing another manufacturing process of the related art semiconductor device.
Figure 7:
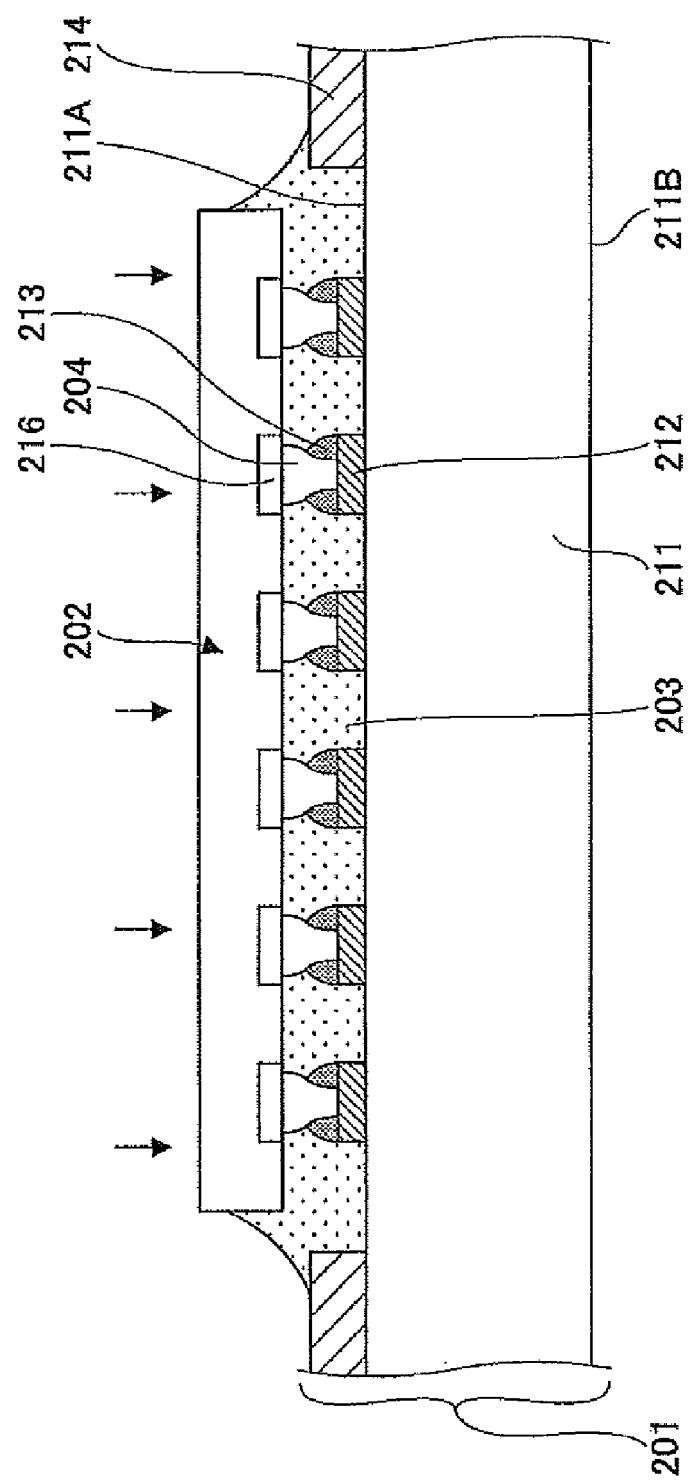
FIG. 7 is a second view showing another manufacturing process of the related art semiconductor device.
Figure 8:
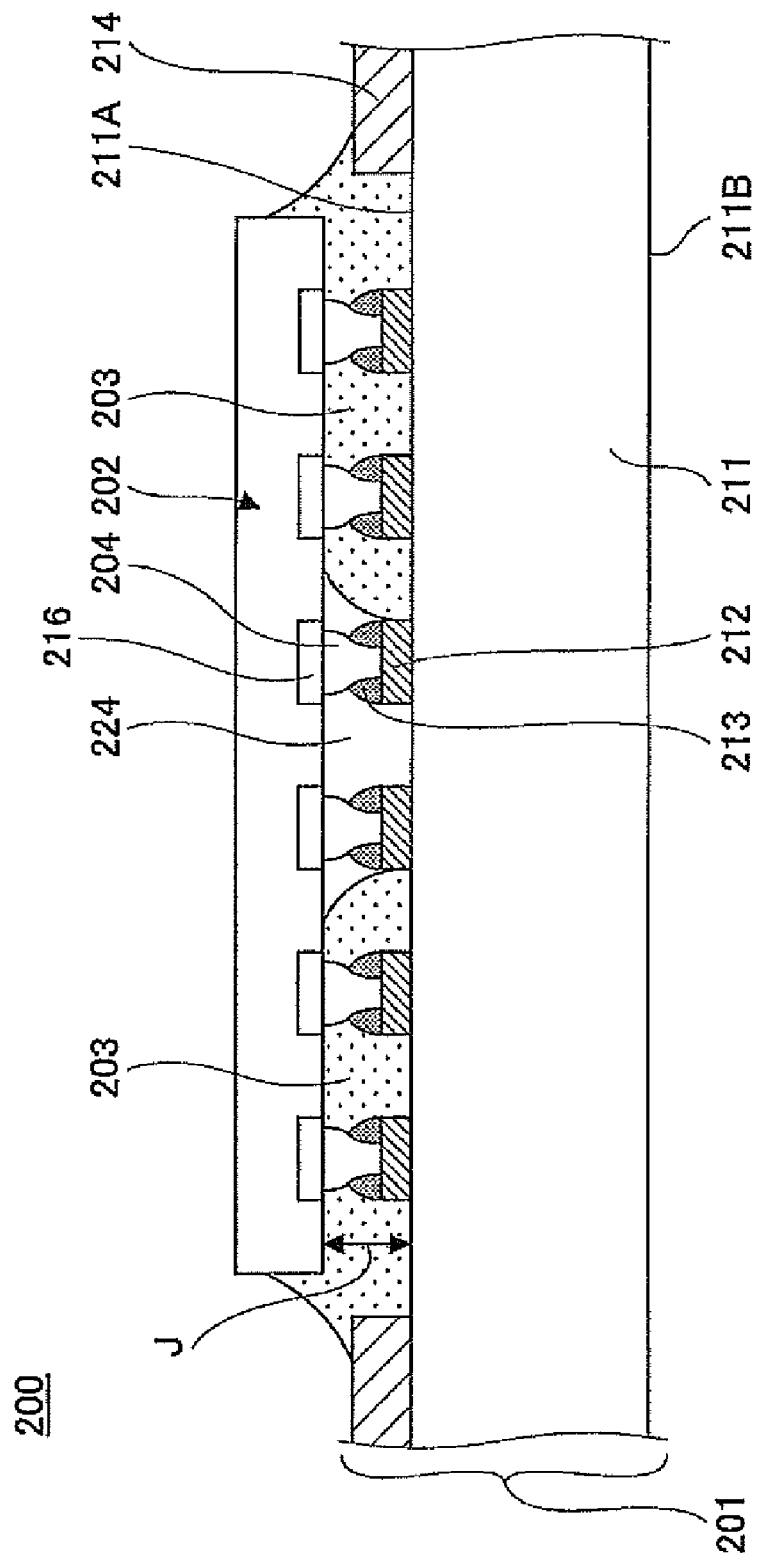
FIG. 8 is a view for explaining problems of the manufacturing process of the related art semiconductor device.
Figure 9:
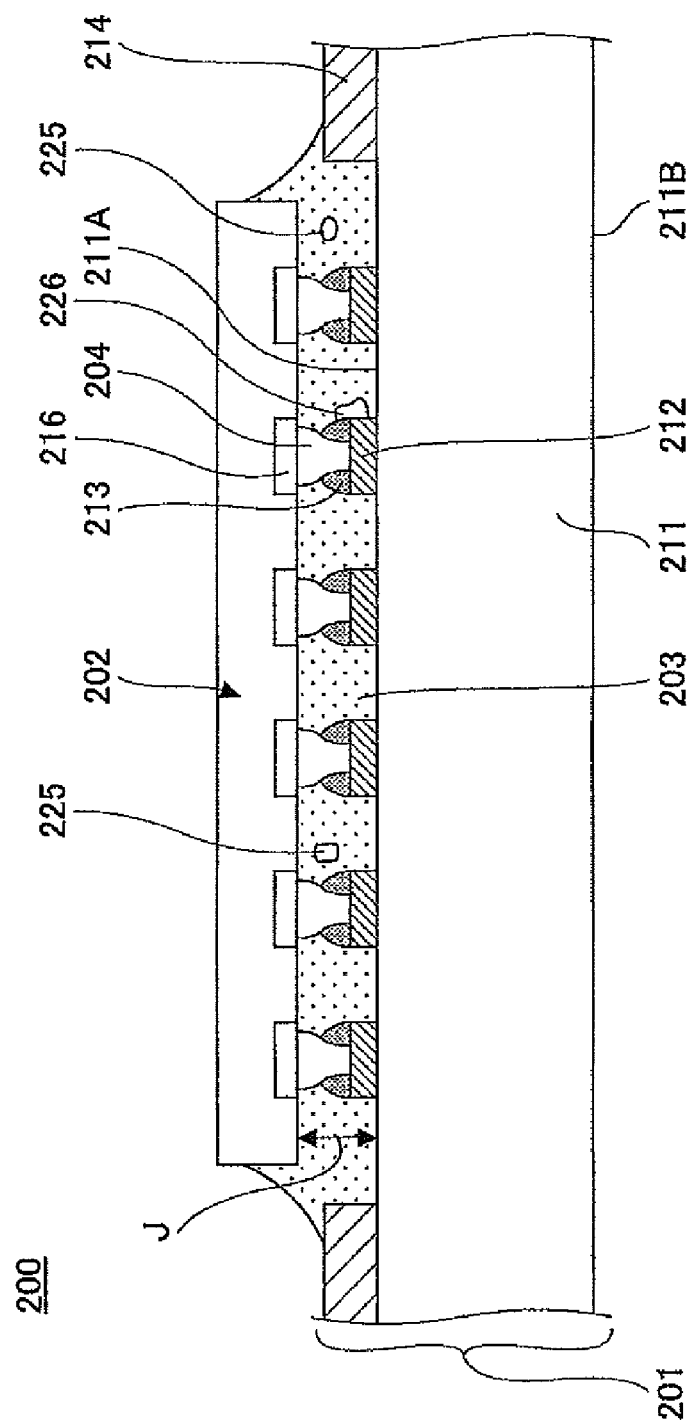
FIG. 9 is a view for explaining problems of another manufacturing process of the related art semiconductor device.
Figure 10:
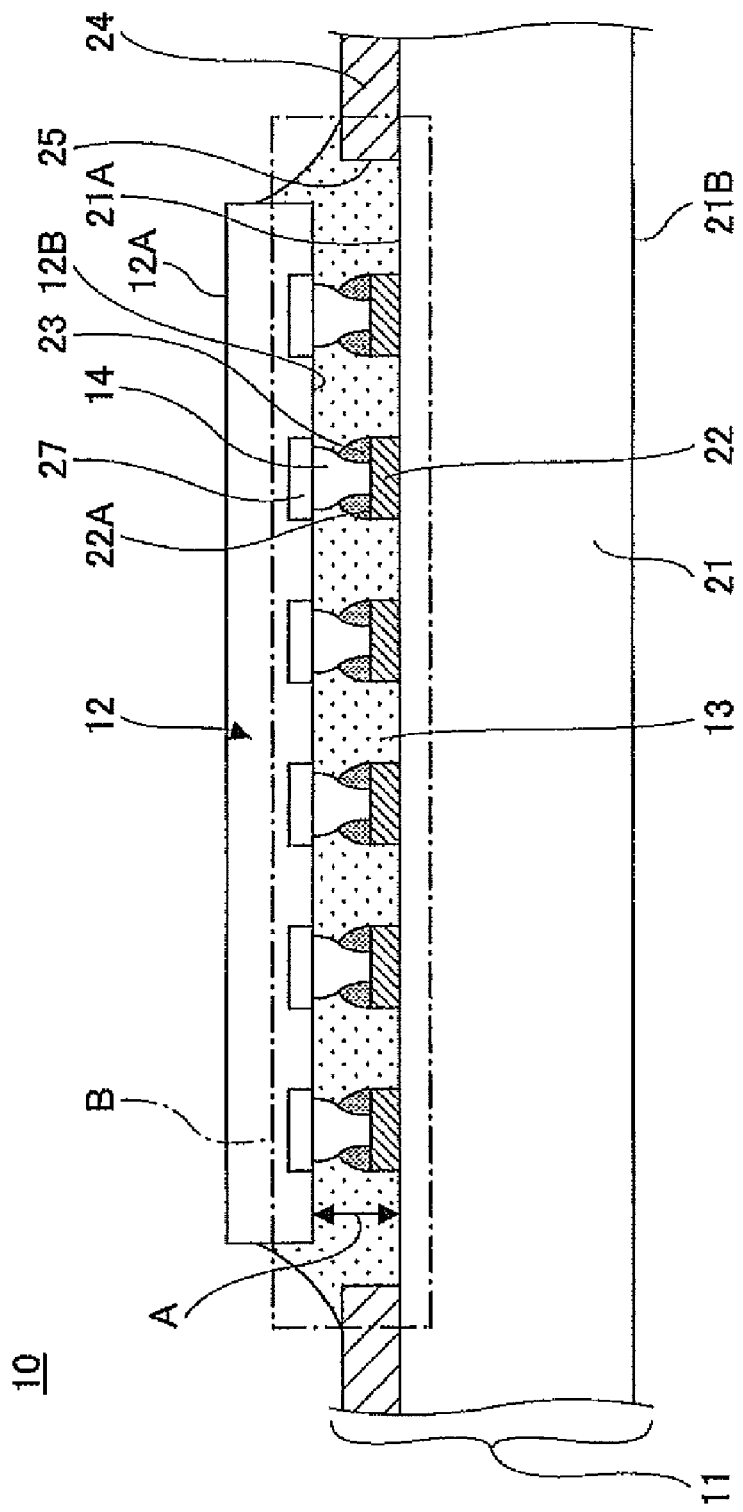
FIG. 10 is a cross-sectional view of a semiconductor device of an embodiment of the present invention.

FIG. 10 is a cross-sectional view of a semiconductor device of an embodiment of the present invention. In FIG. 10, the reference letter "A" (hereinafter "gap A") indicates a gap between a semiconductor chip 12 flip chip connected to a wiring board 11 and a board main body 21. The reference letter "B" (hereinafter "underfill resin forming area B") indicates an area where underfill resin 13 is formed.

As shown in FIG. 10, a semiconductor device 10 of the embodiment of the present invention includes the wiring board 11, the semiconductor chip 12, and the underfill resin 13.

Figure 11:
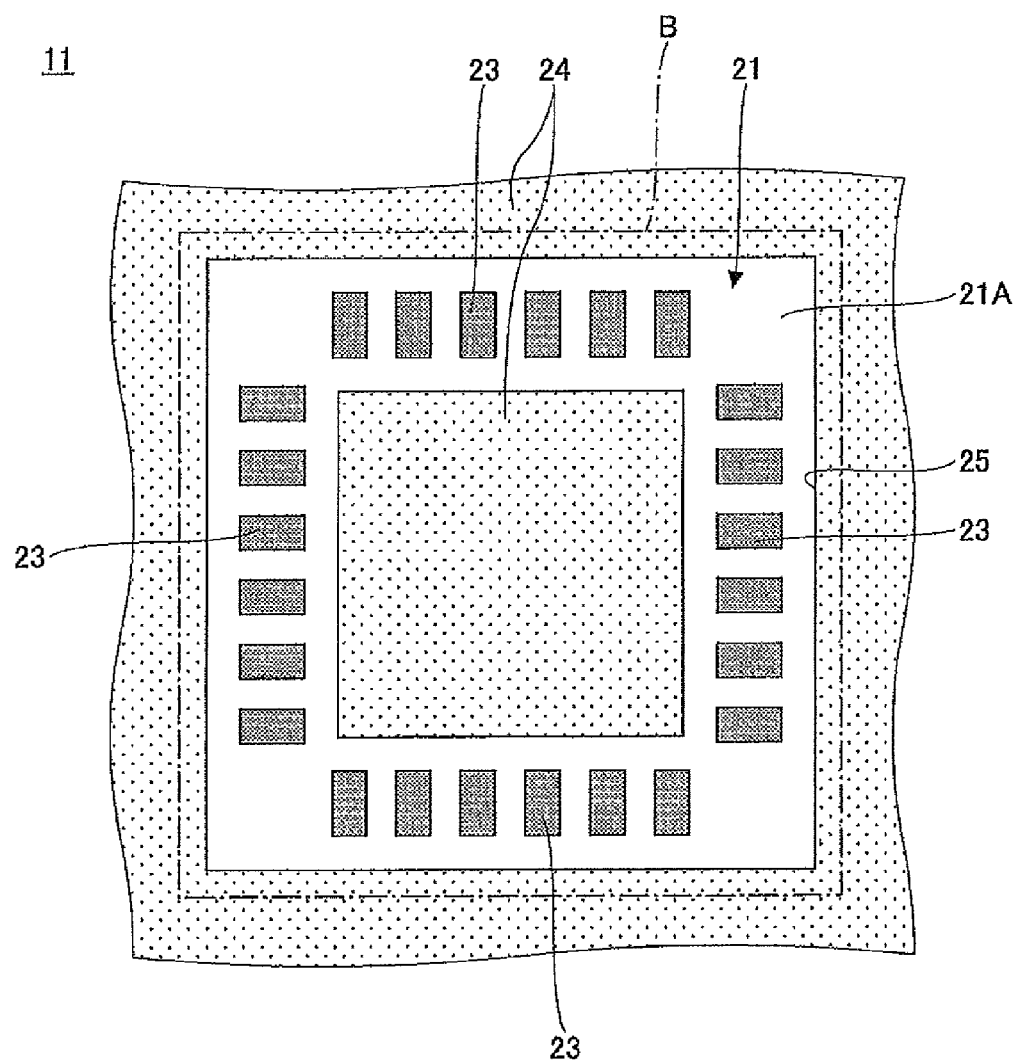
FIG. 11 is a plan view of a wiring board provided in the semiconductor device of the embodiment of the present invention.

FIG. 11 is a plan view of the wiring board 11 provided in the semiconductor device 10 of the embodiment of the present invention. In FIG. 11, parts that are the same as the parts of the semiconductor device 10 shown in FIG. 10 are given the same reference numerals, and explanation thereof is omitted.

As shown in FIG. 10 and FIG. 11, the wiring board 11 includes the board main body 21, pads 22, solders 23, and a solder resist layer 24.

The board main body 21 includes plural stacked insulation layers (not shown in FIG. 11), wiring patterns (not shown in FIG. 11), and outside connection pads (not shown in FIG. 11). The wiring patterns are provided in plural insulation layers and electrically connected to the pads 22. The outside connection pads are provided on a rear surface 21B of the board main body 21 and configured to be electrically connected to the wiring patterns.

The outside connection pads are electrically connected to a mounting board (not shown in FIG. 11) such as a mother board via the outside connection terminals (for example, solder balls) when the semiconductor device 10 is mounted on the mounting board. A built-up board having a core, a coreless board, or the like can be used as the board main body 21.

The pads 22 are provided on a front surface 21A of the board main body 21 of a part exposed at an opening part 25 of the solder resist layer 24. The pads 22 are arranged on the front surface 21A of the board main body 21 in a frame. The pads 22 are electrically connected to a wiring pattern provided in the board main body 21 and the outside connection pads (not shown in FIG. 11). Copper (Cu), for example, can be used as a material of the pads 22. In a case where copper (Cu) is used as the material of the pads 22, the thickness of the pads 22 may be, for example, approximately 10 μm.

The solders 23 are provided on upper surfaces 22A of the pads 22.

The solders 23 are configured to fix bumps 14 such as gold (Au) bumps on the pads 22 connected to electrode pads 27 of the semiconductor chip 12. As the solders 23, for example, an SnAgCu group solder, an SnZnBi group solder, an SnAgInBi group solder, an SnAg group solder, an SnCu group solder, or the like can be used.

The solder resist layer 24 is provided on a front surface 21A of the board main body 21. The solder resist layer 24 includes the opening part 25 configured to expose an area where the pads 22 are formed. The opening part 25 has a frame-shaped configuration. The thickness of the solder resist layer 24 may be, for example, approximately 25 μm.

As shown in FIG. 10, the semiconductor chip 12 includes a semiconductor substrate (not shown in FIG. 10), a semiconductor integrated circuit (not shown in FIG. 10) formed on the semiconductor substrate, and the electrode pads 27 electrically connected to the semiconductor integrated circuit. As the semiconductor substrate, for example, a silicon substrate can be used. The bumps 14 fixed on the pads 22 are provided on the electrode pads 27. The semiconductor chip 12 is flip chip connected to the pads 22 and is electrically connected to the wiring board 11 via the bumps 14. The semiconductor chip 12 has a rectangular-shaped configuration in a planar view. A length of one side of the semiconductor chip 12 may be, for example, approximately 10 mm. The gap "A" between the board main body 21 and the semiconductor chip 12 flip chip connected to the wiring board 11 is, for example, approximately 5 μm through 50 μm.

The underfill resin 13 is arranged so as to fill the gap A between the semiconductor chip 12 and the wiring board 11. The underfill resin 13 is configured to seal the space between the semiconductor chip 12 and the wiring board 11 (more specifically, seal the space between the bumps 14, the solders 23, and the pads 22). For example, thermosetting resin can be used as the underfill resin 13. As the thermosetting resin, for example, epoxy resin having thermosetting properties can be used.

Figure 12:
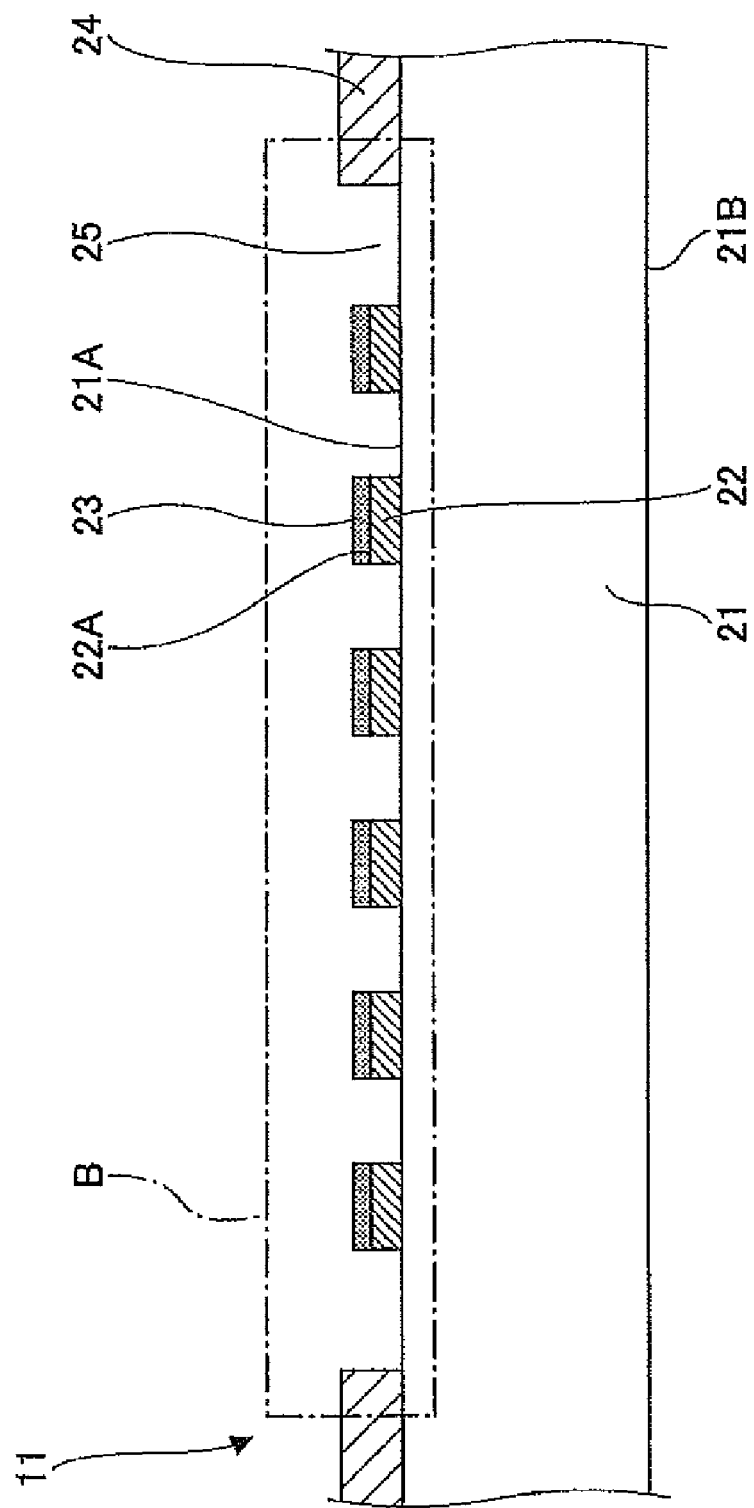
FIG. 12 is a first view showing a manufacturing process of the semiconductor device of the embodiment of the present invention.
Figure 13:
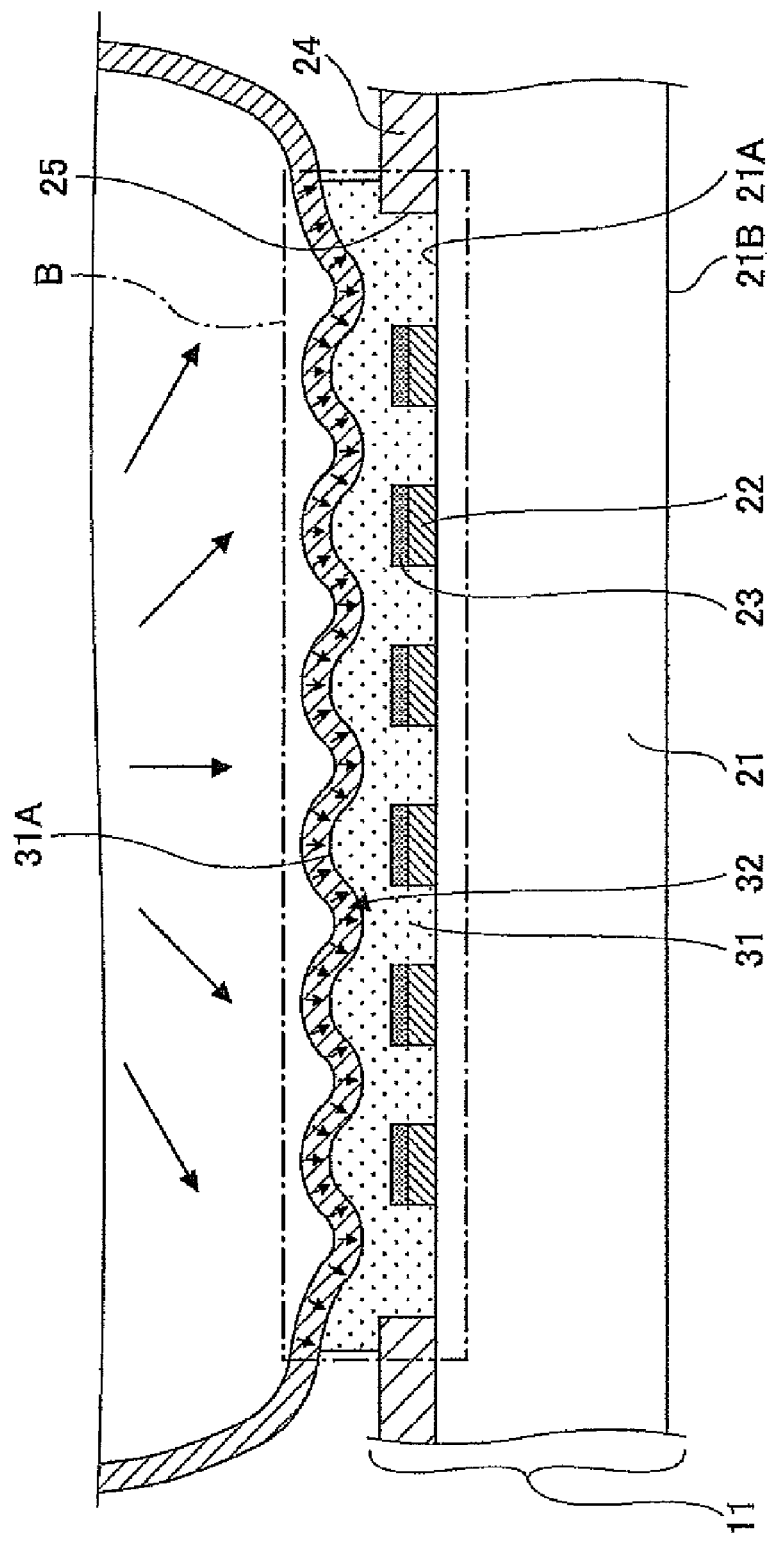
FIG. 13 is a second view showing the manufacturing process of the semiconductor device of the embodiment of the present invention.

FIG. 12 through FIG. 13 show a manufacturing process of the semiconductor device of the embodiment of the present invention. In FIG. 12 and FIG. 13, parts that are the same as the parts of the semiconductor device 10 shown in FIG. 10 are given the same reference numerals, and explanation thereof is omitted.

First, in a step shown in FIG. 12, the wiring board 11 is formed by a known method. The wiring board 11 includes the board main body 21, the pads 22, the solders 23, and the solder resist layer 24 having the opening part 25. A built-up board having a core, a coreless board, or the like can be used as the board main body 21. Copper (Cu), for example, can be used as a material of the pads 22. In a case where copper (Cu) is used as the material of the pads 22, the thickness of the pads 22 may be, for example, approximately 10 μm. As the solders 23, for example, an SnAgCu group solder, an SnZnBi group solder, an SnAgInBi group solder, an SnAg group solder, an SnCu group solder, or the like can be used. The thickness of the solders 23 may be, for example, approximately 10 μm. The thickness of the solder resist layer 24 may be, for example, approximately 25 μm.

Next, in a step shown in FIG. 13, a film state underfill resin 31 in a semi-cured state is adhered on the front surface 21A of the board main body 21 (one of surfaces of the board main body 21) without forming a gap among the front surface 21A of the board main body 21, the pads 22, and the solders 23 (film state underfill resin adhering step).

At this stage (in the film state underfill resin adhering step), since configurations of the pads 22 and the solders 23 are transcribed (transmitted through the underfill resin 31), as shown in FIG. 13, an upper surface 31A of the film state underfill resin 31 has a convexo-concave configuration. The film state underfill resin 31 in the semi-cured state is a base material of the underfill resin 13. When the film state underfill resin 31 is completely cured, the underfill resin 31 becomes the underfill resin 13. As a material of the film state underfill resin 31, for example, thermosetting resin (more specifically, for example, epoxy resin having thermosetting properties) can be used. The thickness of the film state underfill resin 31 may be, for example, approximately 10 μm through approximately 50 μm.

Thus, the film state underfill resin 31 in the semi-cured state is adhered on the front surface 21A of the board main body 21 (one surface of the board main body 21) without forming a gap among the front surface 21A of the board main body 21, the pads 22, and the solders 23. As a result of this, it is possible to prevent a void from being generated between the front surface 21A of the board main body 21, the pads 22, the solders 23, and inside the underfill resin 13.

More specifically, in the film state underfill resin adhering step, for example, the film state underfill resin 31 in the semi-cured state mounted on a part of the wiring board 11 corresponding to the underfill resin forming area B is pressed by a diaphragm 32 provided in a diaphragm type laminate apparatus under a vacuum environment. As a result of this, the film state underfill resin 31 is adhered on the wiring board 11. See FIG. 13. The diaphragm 32 is like a rubber balloon and is expanded by, for example, air. The diaphragm 32 can apply a substantially uniform pressure to the film state underfill resin 31 of a part coming in contact with the diaphragm 32. As a material of the diaphragm 32, for example, silicon rubber can be used.

Thus, by using the diaphragm type laminate apparatus under a vacuum environment, the film state underfill resin 31 in the semi-cured state is adhered to the wiring board 11 so that a substantially even pressure is applied to a part of the underfill resin 31 coming in contact with the diaphragm 32. In other words, the underfill resin 31 is tightly pressed so that the underfill resin 31 moves to corner parts formed by lower side surfaces of the pads 22 and the front surface 21A, which are where gaps may be easily formed. Because of this, it is possible to prevent the voids from being generated between the underfill resin 13, the front surface 21A of the board main body 21, the pads 22, and the solders 23, and inside the underfill resin 13.

Process conditions in the case where the film state underfill resin 31 in the semi-cured state is adhered by using the diaphragm type laminate apparatus are as follows. For example, a vacuum reduced pressure of a process room (an area where the wiring board 11 is provided) of the diaphragm type laminate apparatus may be approximately 100 Pa. The pressure at which the film state underfill resin 31 is pressed by the diaphragm 32 may be approximately 0.3 MPa. A heating temperature of the underfill resin 31 in the semi-cured state may be approximately 100° C.

Figure 14:
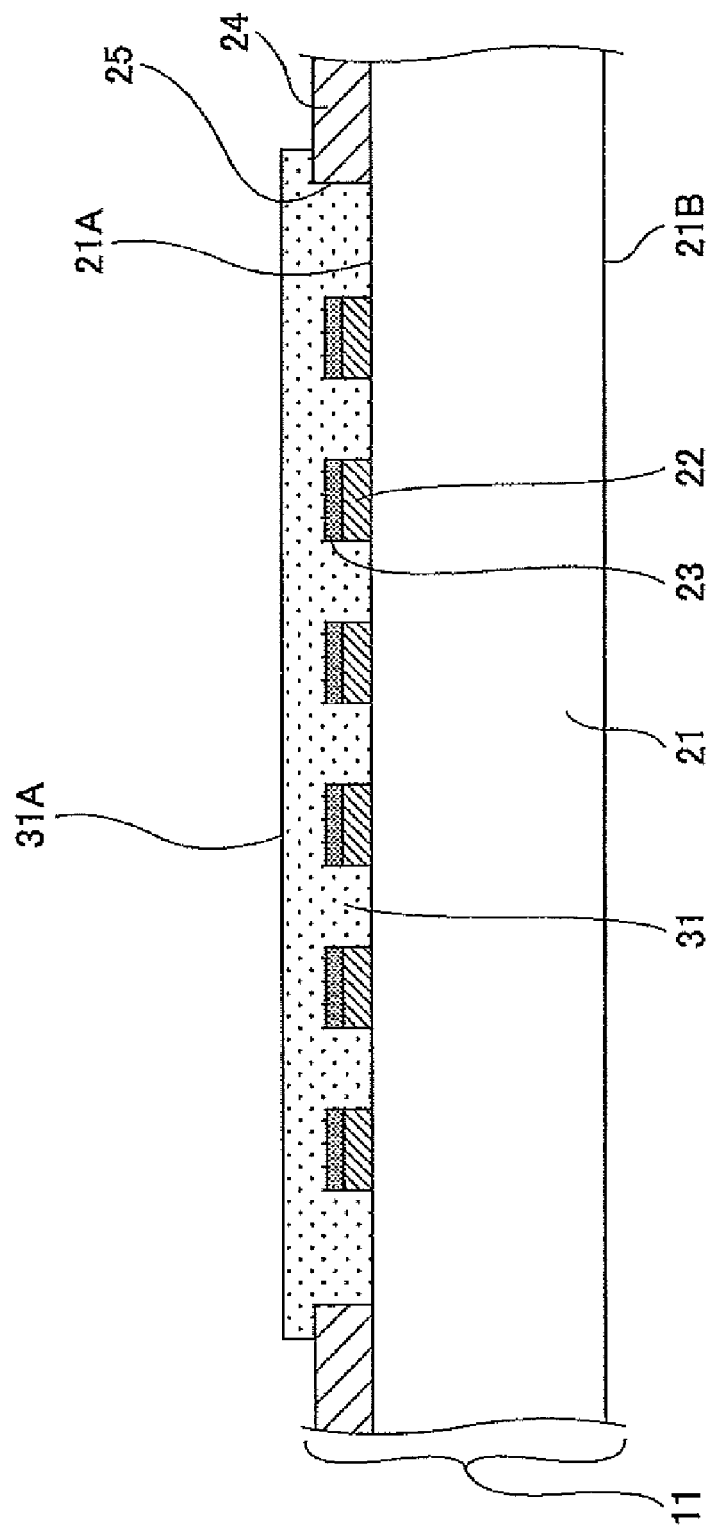
FIG. 14 is a third view showing the manufacturing process of the semiconductor device of the embodiment of the present invention.

Next, in a step shown in FIG. 14, the upper surface 31A of the film state underfill resin 31 in the semi-cured state having a convexo-concave configuration (namely, the underfill resin 31 shown in FIG. 13) is flattened (flattening step). As a result of this, the upper surface 31A of the underfill resin 31 is flattened.

Thus, by making the upper surface 31A of the film state underfill resin 31 in the semi-cured state flat, air bubbles may not be formed in the underfill resin 31 when the semiconductor chip 12 is pressed to the underfill resin 31 so as to be flip chip connected to the pads 22. Therefore, it is possible to prevent voids from being formed between the semiconductor chip 12 and the underfill resin 13.

In the flattening step, more specifically, for example, after a flat surface of a plate (not shown in FIG. 14) comes in contact with the upper surface 31A of the film state underfill resin 31 having the convexo-concave configuration, the underfill resin 31 is pressed via the plate from the upper surface 31A side of the underfill resin 31. As a result of this, the upper surface 31A of the underfill resin 31 in the semi-cured state is made flat.

In addition, for example, a plate (not shown in FIG. 11) having a flat surface may be arranged inside the diaphragm 32 of the diaphragm type laminate apparatus discussed above where the inside surface of the diaphragm 32 faces the flat surface of the plate. The upper surface 31A of the film state underfill resin 31 having the convexo-concave configuration may be pressed by the plate and the diaphragm 32. As a result of this, the upper surface 31A of the underfill resin 31 in the semi-cured state can be made flat. The process conditions of this case are, for example, as follows. A vacuum reduced pressure of a processing room (an area where the wiring board 11 is provided) of the diaphragm type laminate apparatus may be approximately 100 Pa. The pressure at which the underfill resin 31 is pressed by the diaphragm 32 may be approximately 0.3 MPa. A heating temperature of the underfill resin 31 in the semi-cured state may be approximately 100° C.

Figure 15:
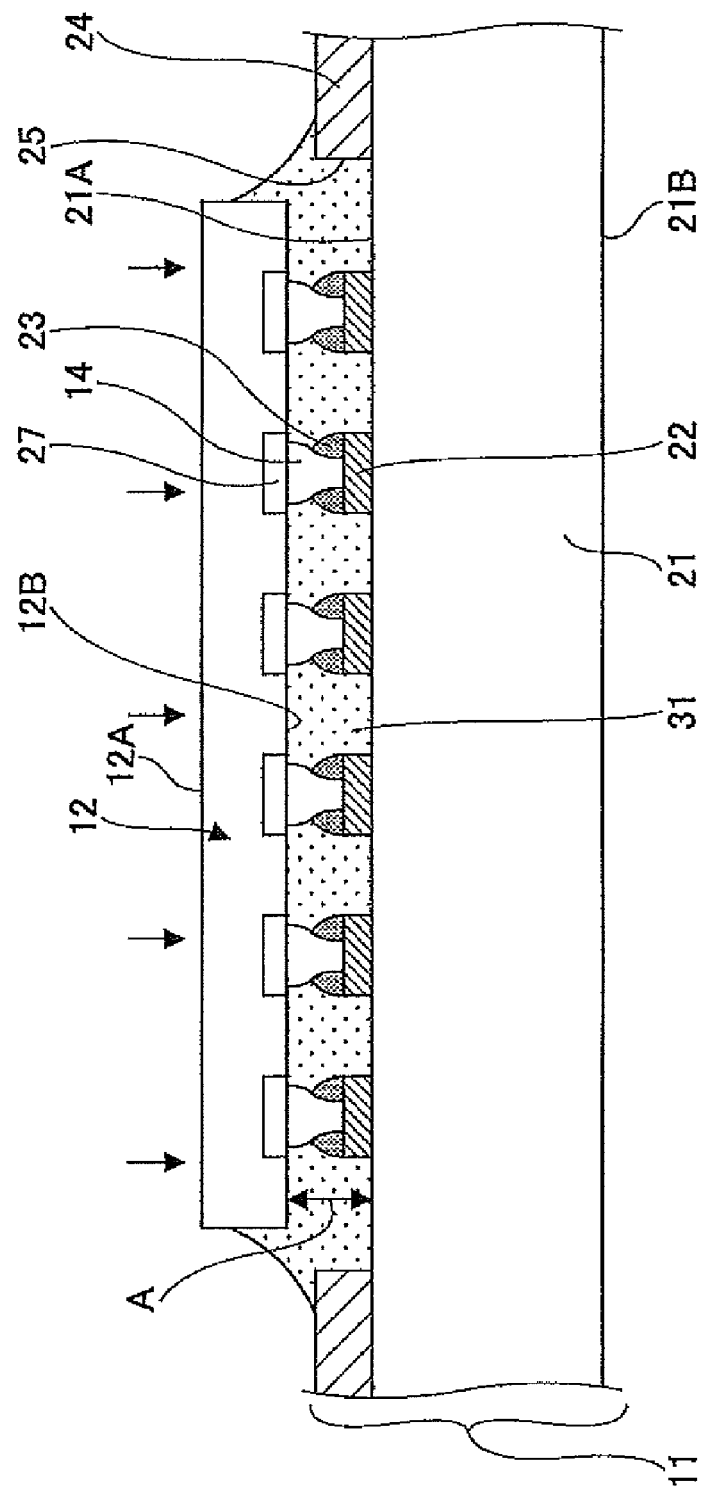
FIG. 15 is a fourth view showing the manufacturing process of the semiconductor device of the embodiment of the present invention.

Next, in a step shown in FIG. 15, the semiconductor chip 12 where the bumps 14 (for example, Au bumps) are provided on the electrode pads 27 is pressed onto the upper surface (flat surface) 31A side of the film state underfill resin 31 in the semi-cured state shown in FIG. 15. The bumps 14 and the molten solders 23 come in contact with each other. In this case, the heating temperature when the solders 23 are melted is for example, approximately 230° C. and the heating time is, for example, several seconds. As a result of this, the semiconductor chip 12 is flip chip connected to the pads 22 (chip connecting step). The gap A between the board main body 21 and the semiconductor chip 12 flip chip connected to the wiring board 11 may be, for example, approximately 5 μm through approximately 50 μm.

Figure 16:
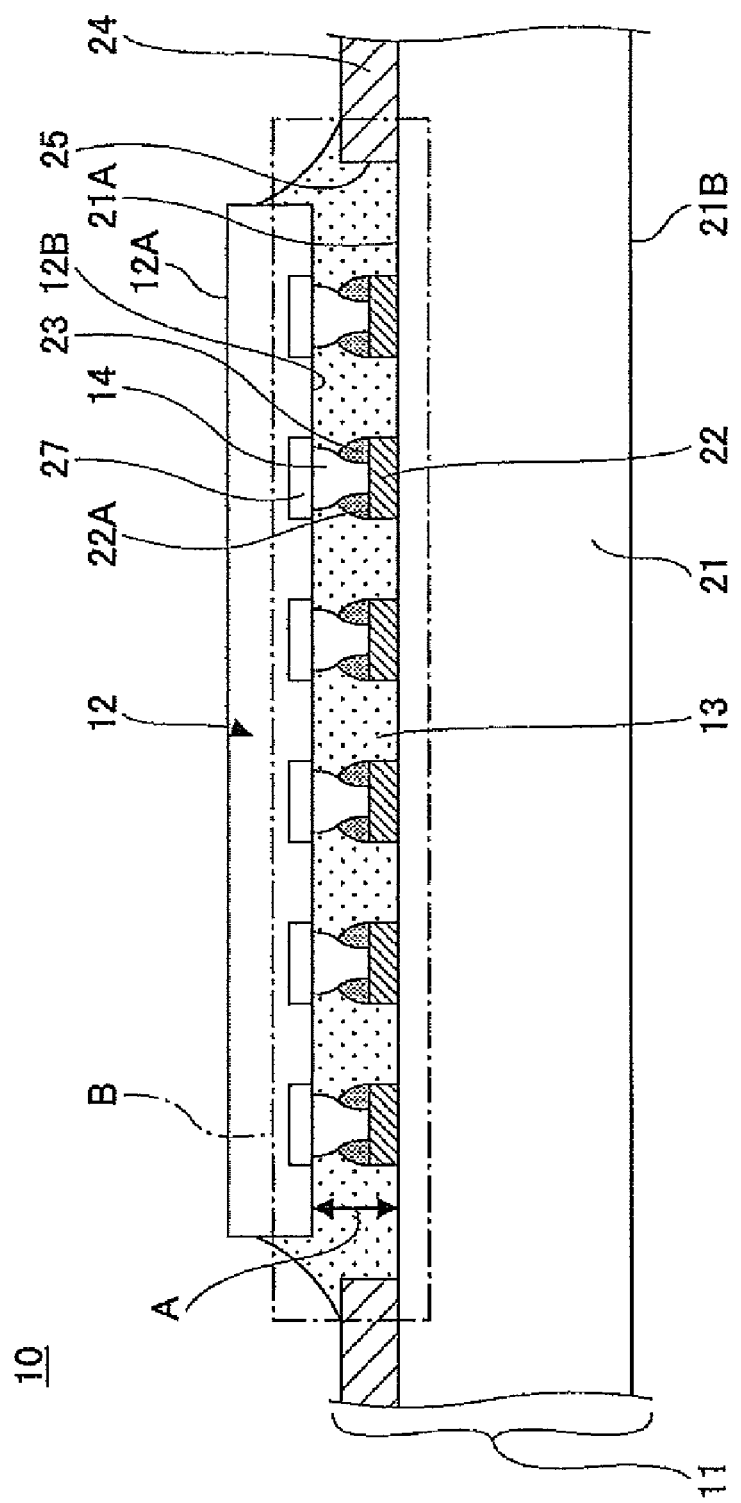
FIG. 16 is a fifth view showing the manufacturing process of the semiconductor device of the embodiment of the present invention.

Next, in a step shown in FIG. 16, the film state underfill resin 31 in the semi-cured state shown in FIG. 15 is completely cured so that the underfill resin 13 configured to seal between the semiconductor chip 12 and the wiring board 11 is formed (underfill resin forming step). As a result of this, the semiconductor device 10 of the embodiment of the present invention is manufactured. In the underfill resin forming step, in a case where thermosetting resin (more specifically, for example, thermosetting epoxy resin) is used as a material of the film state underfill resin 31, the underfill resin 31 is heated for a designated time (for example, approximately 1 hour at approximately 150° C. through approximately 200° C.), and thereby the underfill resin 13 is formed.

Furthermore, in the underfill resin forming step, for example, the underfill resin 31 may be completely cured under the vacuum environment so that the underfill resin 13 can be formed. As a result of this, since gas generated when the underfill resin 31 is cured is discharged to the outside, it is possible to prevent voids from being generated in the underfill resin 13.

According to the manufacturing method of the semiconductor device of the embodiment of the present invention, the film state underfill resin 31 in the semi-cured state is adhered to the front surface 21A of the board main body 21 without forming the gap between the front surface 21A of the board main body 21 and the pads 22. Then, the upper surface 31A of the film state underfill resin 31 in the semi-cured state is flattened. After that, the semiconductor chip 12 is pressed onto the film state underfill resin 31 whose upper surface 31A is flattened so that the semiconductor chip 12 is flip chip connected to the pads 22. As a result of this, air bubbles are not formed between the film state underfill resin 31 and the pads 22 of the board main body 21, inside the underfill resin 31, and between the semiconductor chip 12 and the underfill resin 31. Because of this, voids are not generated in the underfill resin 13 formed by curing the film state underfill resin 31. Hence, it is possible to improve the manufacturing yield of the semiconductor device 10.

In the above-discussed embodiment of the present invention, the chip connecting step and the underfill resin forming step are separately performed. However, the chip connecting step and the underfill resin forming step may be concurrently performed and thereby it is possible to simplify the manufacturing process of the semiconductor device 10.

Figure 17:
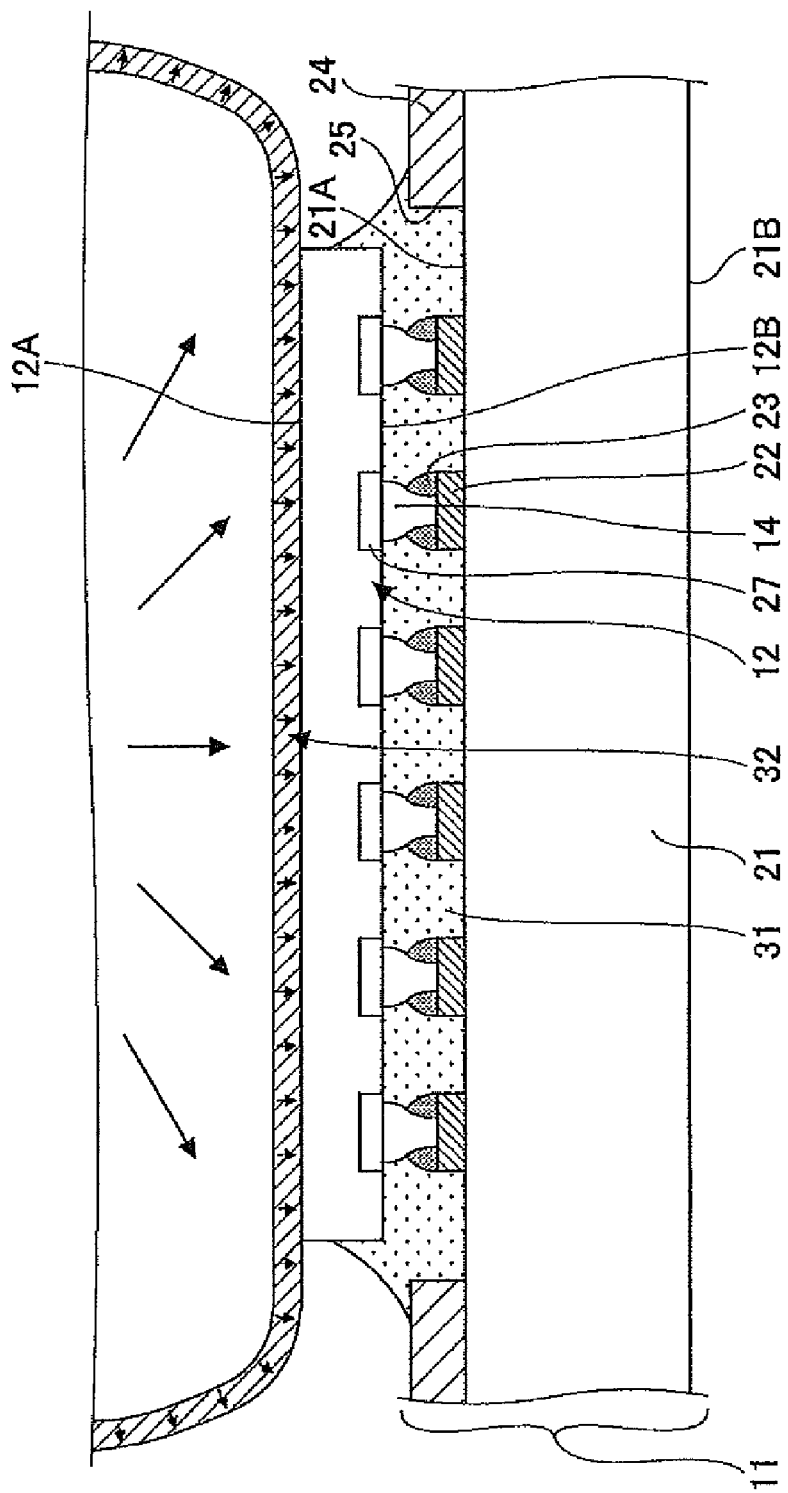
FIG. 17 is a first view showing another example of an underfill resin forming step.
Figure 18:
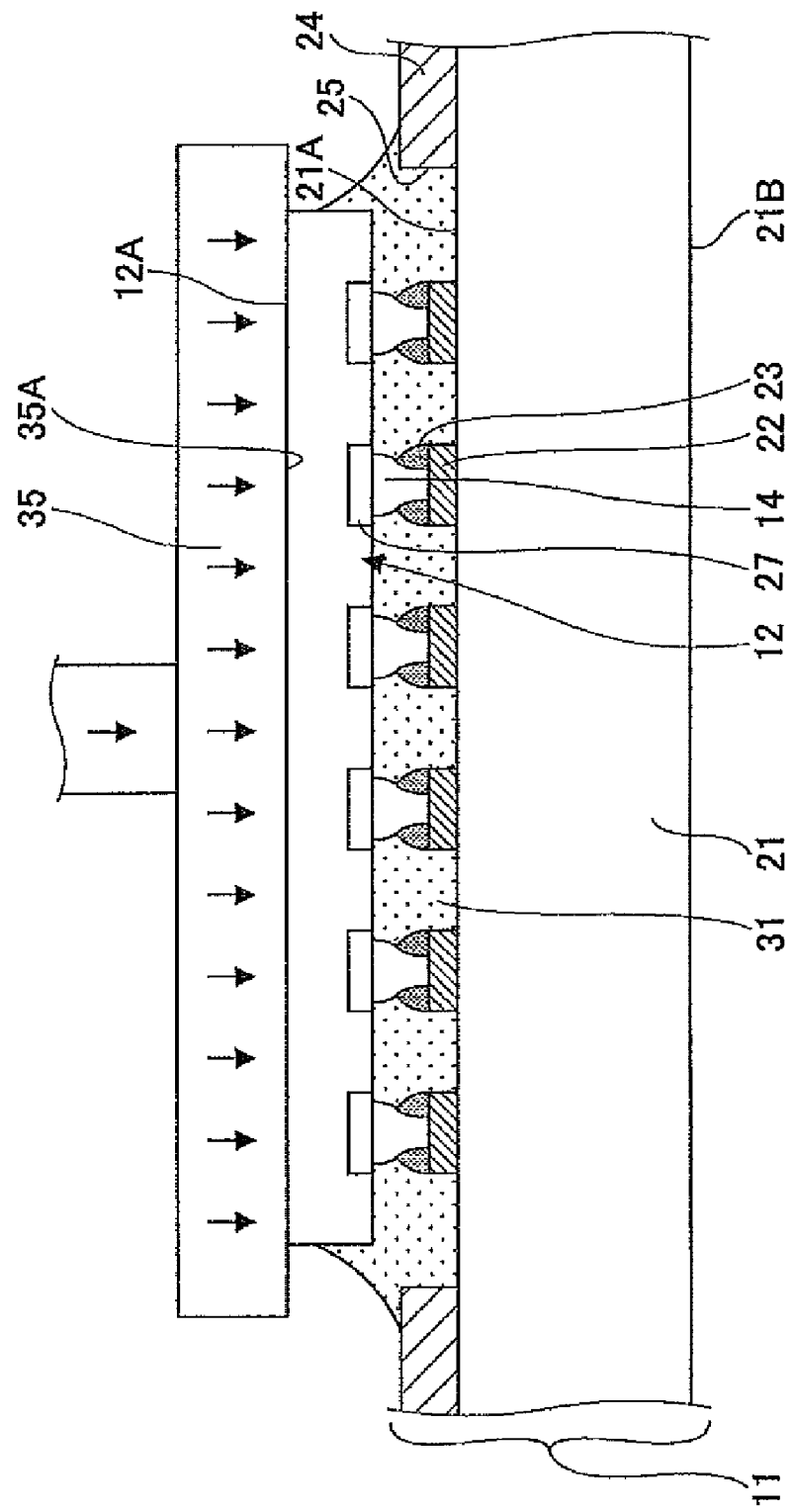
FIG. 18 is a second view showing another example of the underfill resin forming step.

FIG. 17 and FIG. 18 show another example of the underfill resin forming step.

In the above-discussed manufacturing method of the semiconductor device of the embodiment of the present invention, the film state underfill resin 31 is completely cured without pressing the semiconductor chip 12. However, as discussed in FIG. 17, while the front surface 12A of the semiconductor chip 12 is pressed at a substantially even pressure by the above-mentioned diaphragm 32, the underfill resin 31 may be completely cured. In other words, while a surface of the semiconductor chip 12 opposite to the surface 12B where the electrode pads 27 are provided is pressed at a substantially even pressure by the above-mentioned diaphragm 32, the underfill resin 31 may be completely cured. In a case where the underfill resin 31 is thermosetting resin, while the surface 12A of the semiconductor chip 12 is pressed and the underfill resin 31 is heated, the underfill resin 31 may be completely cured.

In addition, as shown in FIG. 18, while the upper surface 12A of the semiconductor chip 12 is pressed at a substantially even pressure by the plate 35 having the flat surface 35A, the film state underfill resin 31 may be completely cured. In a case where the underfill resin 31 is thermosetting resin, while the surface 12A of the semiconductor chip 12 is pressed and the underfill resin 31 is heated, the underfill resin 31 may be completely cured.

Thus, in the underfill resin forming step, while the upper surface 12A of the semiconductor chip 12 is pressed at a substantially even pressure, the film state underfill resin 31 is completely cured. As a result of this, it is possible to prevent voids from being generated in the underfill resin 13.

FIG. 19 through FIG. 23 are views showing a manufacturing process of a first modified example of the semiconductor device of the present invention. In FIG. 19 through FIG. 23, parts that are the same as the parts of the semiconductor device 10 of FIG. 10 are given the same reference numerals, and explanation thereof is omitted.

Figure 19:
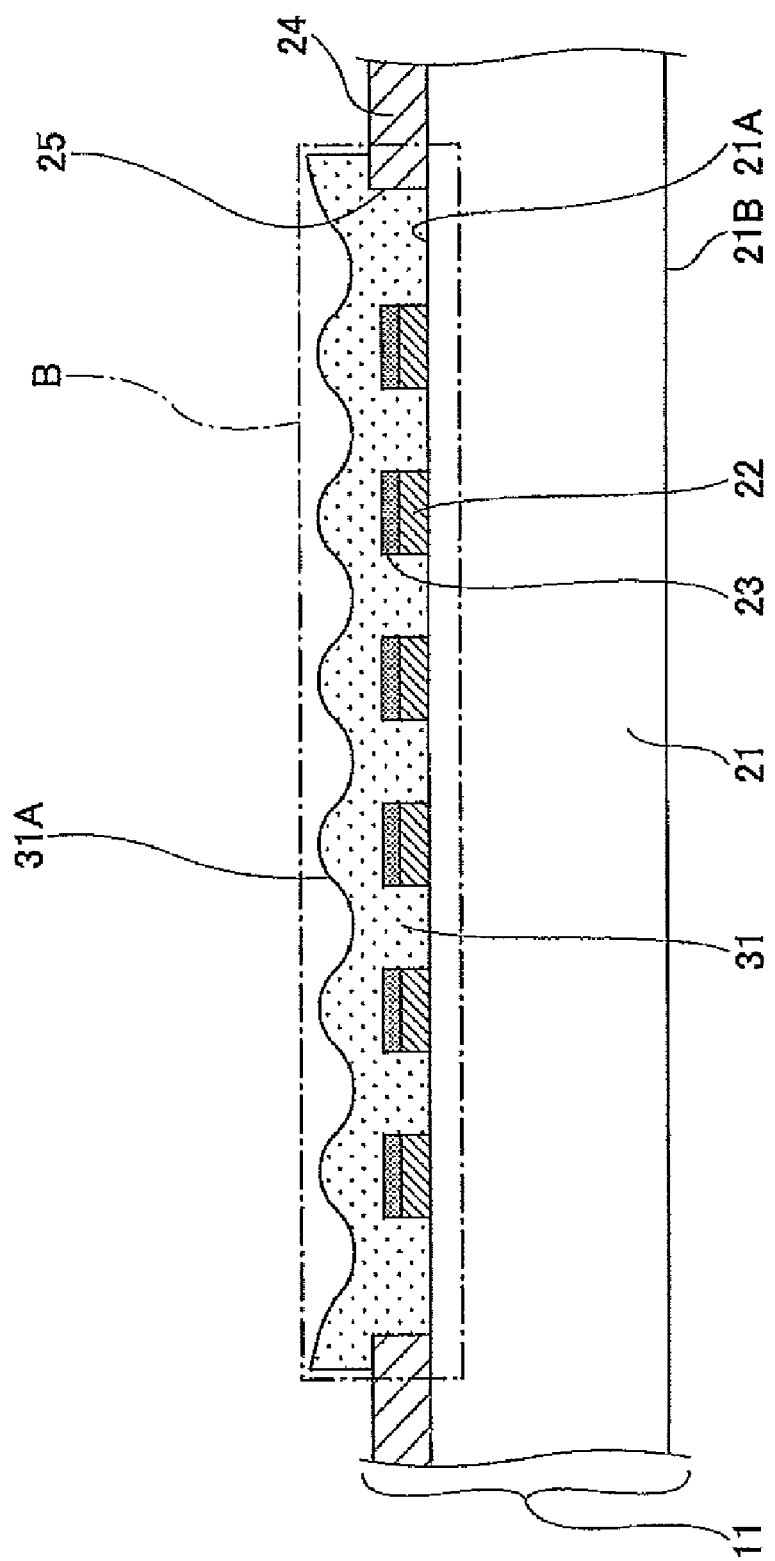
FIG. 19 is a first view showing a manufacturing process of a first modified example of the semiconductor device of the present invention.

The first modified example of the manufacturing method of the semiconductor device 10 of the embodiment of the present invention is discussed with reference to FIG. 19 through FIG. 23. First, in the step shown in FIG. 19, the same steps as those shown in FIG. 12 and FIG. 13 are performed, so that a structural body shown in FIG. 19 is formed. More specifically, the wiring board 11 and the film state underfill resin 31 in the semi-cured state having the convexo-concave configuration are formed.

Figure 20:
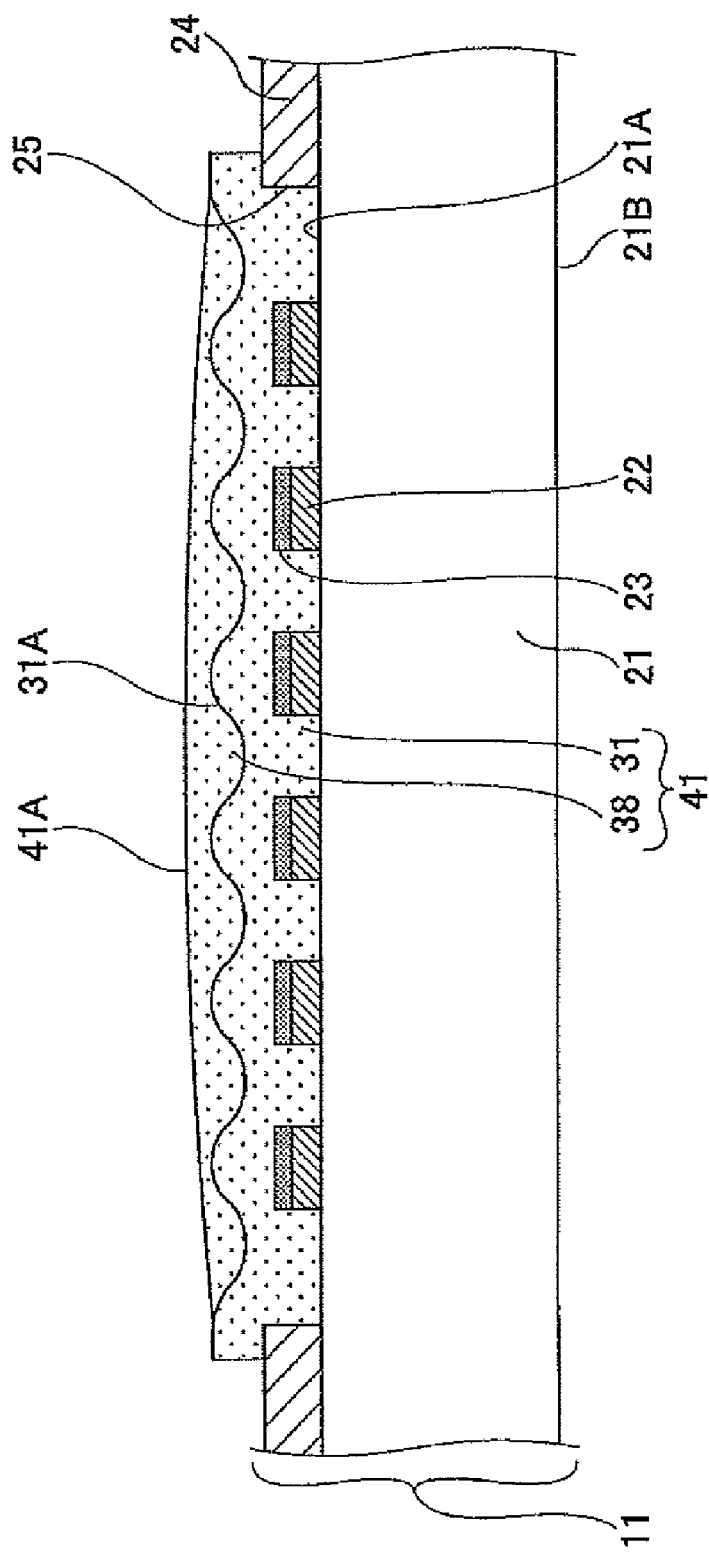
FIG. 20 is a second view showing the manufacturing process of the first modified example of the semiconductor device of the present invention.

Next, in a step shown in FIG. 20, another film state underfill resin in the semi-cured state (not shown in FIG. 20) or liquid state underfill resin 38 is formed on the upper surface 31A of a part of the underfill resin 31 where the opening part 25 is formed. As a result of this, an underfill resin base material 41 in the semi-cured state is formed (underfill resin base material forming step). The underfill resin base material 41 is made of the underfill resin 31 in the semi-cured state and the other film state underfill resin or the underfill resin 31 in the semi-cured state and the liquid state underfill resin 38. When the underfill resin base material 41 is completely cured, the material 41 becomes the underfill resin 13.

In the underfill resin base material forming step, for example, in the case where another film state underfill resin (not shown) is formed on the upper surface 31A of the film state underfill resin 31, this other film state underfill resin is formed by the same method as the step shown in FIG. 13. The same resin as the above-mentioned film state underfill resin 31 can be used as the other film state underfill resin.

In the underfill resin base material forming step, for example, in the case where the liquid state underfill resin 38 is formed on the upper surface 31A of the film state underfill resin 31, the resin 38 is formed by application. As the liquid state underfill resin 38, for example, liquid state thermosetting resin (for example, thermosetting epoxy resin) can be used.

Thus, in this example, on the upper surface 31A of the film state underfill resin 31, another film state underfill resin or the liquid state underfill resin 38 which becomes a part of the underfill resin 13 is formed. Accordingly, even in a case where the area of the opening part 25 of the solder resist layer 24 is large or the depth of the opening part 25 of the solder resist layer 24 is deep, it is possible to securely seal between the semiconductor element 12 and the wiring board 11 with the underfill resin 13.

Furthermore, in the above-mentioned underfill resin base material forming step, for example, in the case where the liquid state underfill resin 38 is formed on the upper surface 31A of the film state underfill resin 31, the underfill resin 38 is provided in the concave part of a convexo-concave part formed in the upper surface 31A of the underfill resin 31 and therefore it is possible to make the upper surface 41A of the underfill resin base material 41 substantially flat. Hence, the semiconductor chip 12 may be flip chip connected to the wiring board 11 without performing the flattening step just after the liquid state underfill resin 38 is formed.

Figure 21:
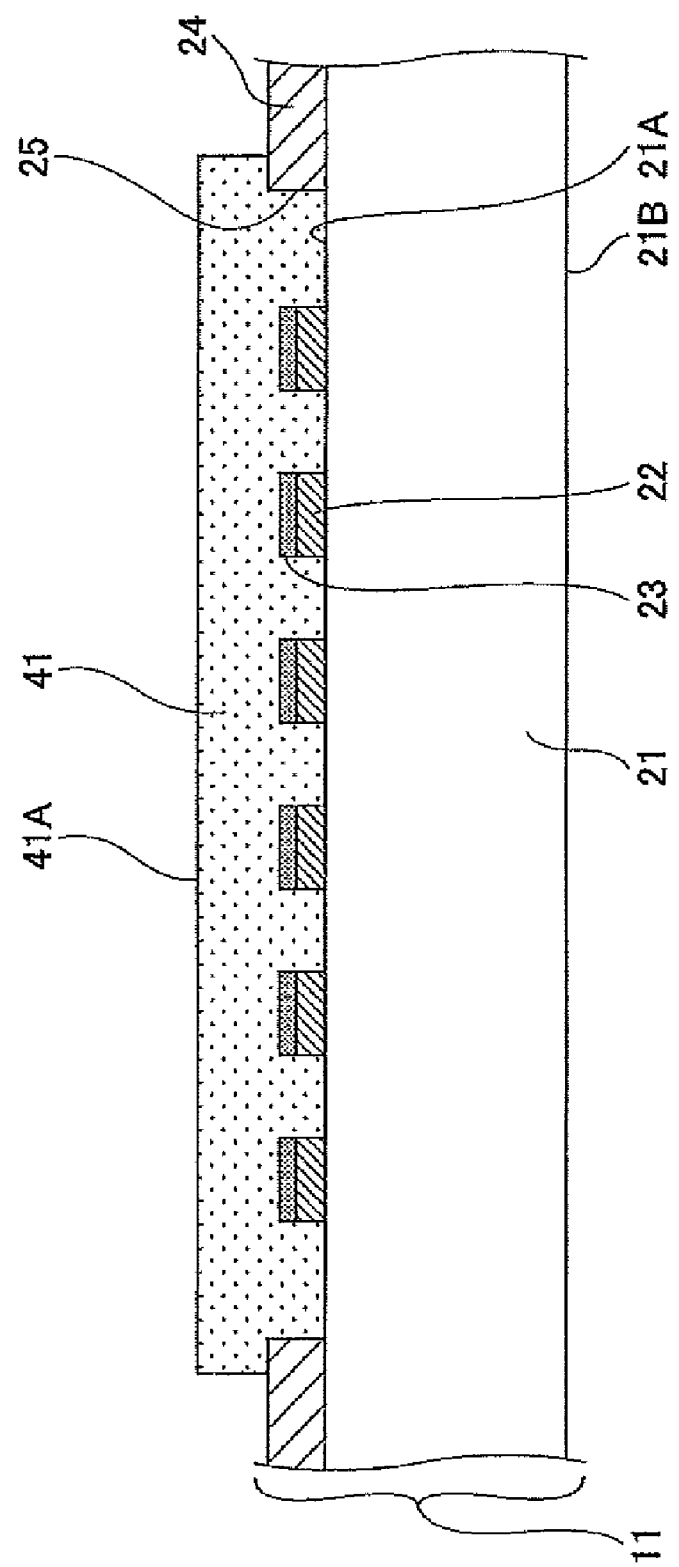
FIG. 21 is a third view showing the manufacturing process of the first modified example of the semiconductor device of the present invention.

In addition, in a case where the viscosity of the liquid state underfill resin 38 is high so that the upper surface 41A of the underfill resin base material 41 does not become substantially flat, a flattening step shown in FIG. 21 is applied and the semiconductor chip 12 is flip chip connected to the wiring board 11 after the flattening step. As a result of this, it is possible to achieve flip chip connecting with high reliability.

In the example shown in FIG. 20, the liquid state underfill resin 38 is applied on the upper surface 31A of the film state underfill resin 31.

Next, in a step shown in FIG. 21, by the same method as the step discussed above with reference to FIG. 14, the upper surface 41A of the underfill resin base material 41 in the semi-cured state is flattened (flattening step). As a result of this, the upper surface 41A of the underfill resin base material 41 is made flat.

Thus, the upper surface 41A of the underfill resin base material 41 in the semi-cured state is made flat. Therefore, when the semiconductor chip 12 is pressed into the underfill resin base material 41 so that the semiconductor chip 12 is flip chip connected to the pads 22, the air bubbles may not be formed in the underfill resin base material 41. Accordingly, it is possible to prevent voids from being generated between the semiconductor chip 12 and the underfill resin 13.

Figure 22:
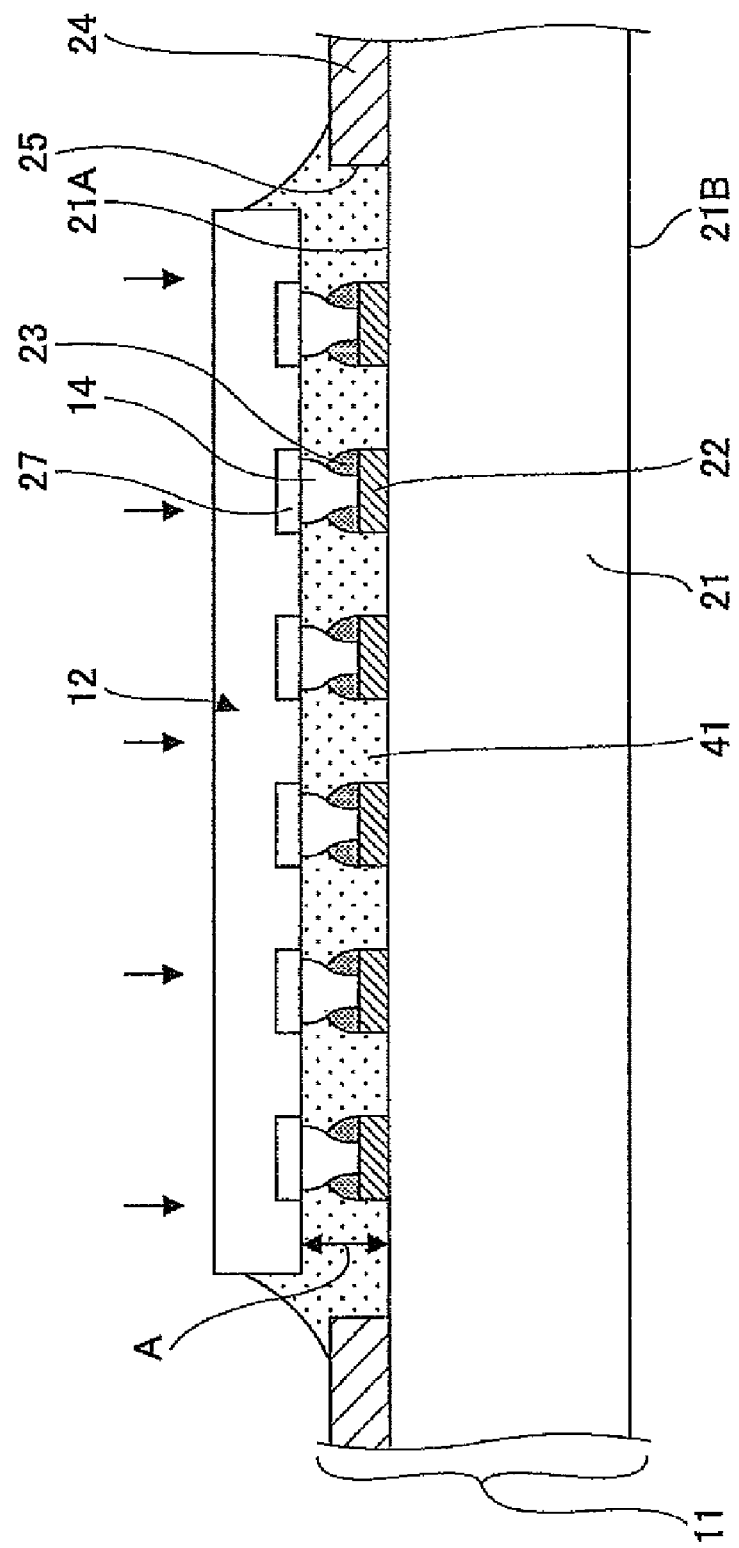
FIG. 22 is a fourth view showing the manufacturing process of the first modified example of the semiconductor device of the present invention.

Next, in a step shown in FIG. 22, the semiconductor chip 12 where the bumps 14 (for example, Au bumps) are provided on the electrode pads 27 is pressed from the upper surface (flat surface) 41A side of the underfill resin base material 41 in the semi-cured state shown in FIG. 21. The bumps 14 and the molten solders 23 come in contact with each other. In this case, the heating temperature when the solders 23 are melted is, for example, approximately 230° C. and the heating time is, for example, several seconds. As a result of this, the semiconductor chip 12 is flip chip connected to the pads 22 (chip connecting step). The gap A between the board main body 21 and the semiconductor chip 12 flip chip connected to the wiring board 11 may be, for example, approximately 5 μm through approximately 50 μm.

Figure 23:
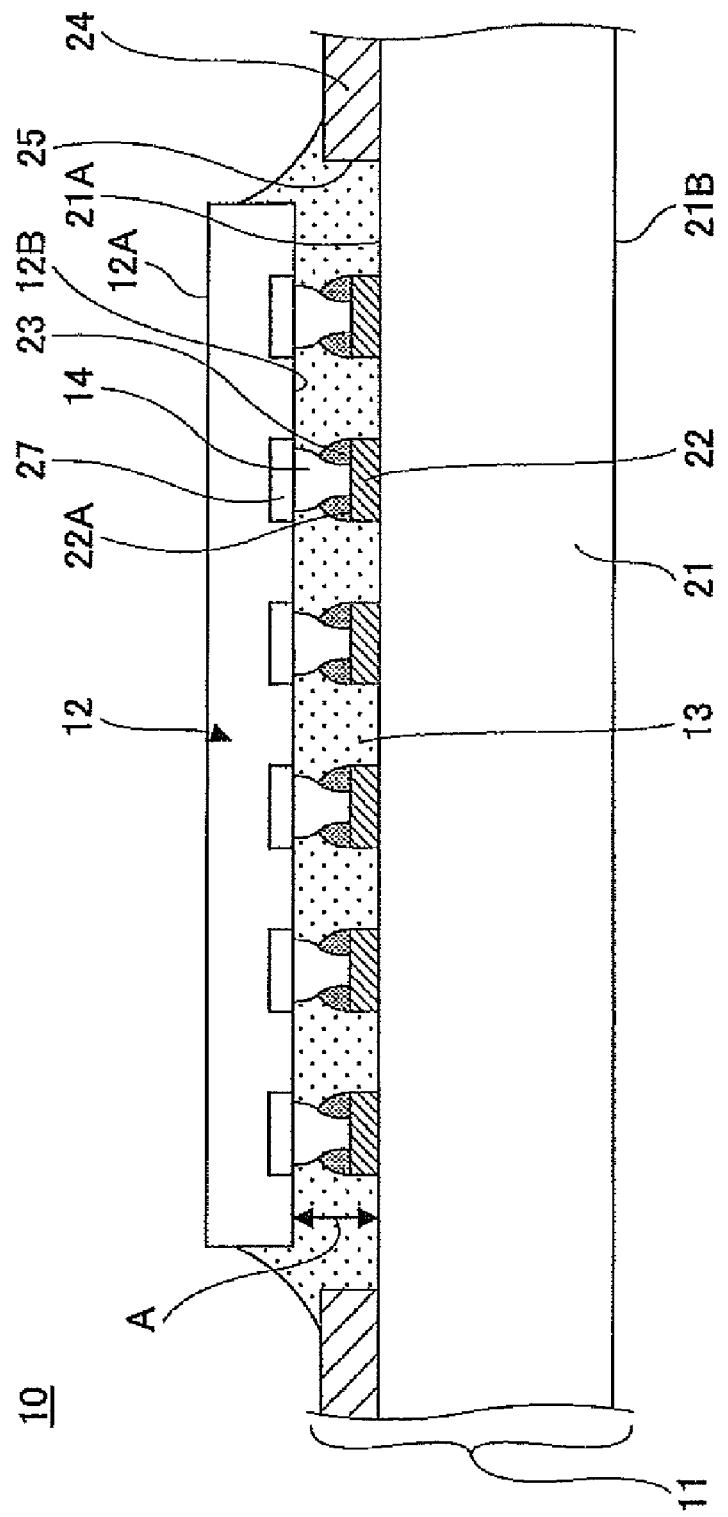
FIG. 23 is a fifth view showing the manufacturing process of the first modified example of the semiconductor device of the present invention.

Next, in a step shown in FIG. 23, by the same method as the step discussed with reference to FIG. 16, the underfill resin base material 41 in the semi-cured state shown in FIG. 22 is completely cured so that the underfill resin 13 configured to seal between the semiconductor chip 12 and the wiring board 11 is formed (underfill resin forming step). As a result of this, the semiconductor device 10 of the embodiment of the present invention is manufactured.

In the underfill resin forming step, in a case where thermosetting resin (more specifically, for example, thermosetting epoxy resin) is used as a material of the underfill resin base material 41, the underfill resin base material 41 is heated for a designated time (for example, approximately 1 hour at approximately 150° C. through approximately 200° C.), and thereby the underfill resin 13 is formed.

Furthermore, in the underfill resin forming step, for example, the underfill resin base material 41 in the semi-cured state may be completely cured under the vacuum environment so that the underfill resin 13 can be formed. As a result of this, since gas generated when the underfill resin base material 41 is cured is discharged to the outside, it is possible to prevent voids from being generated in the underfill resin 13.

According to the first modified example of the manufacturing method of the semiconductor device of the embodiment of the present invention, another film state underfill resin or the liquid state underfill resin 38 which becomes a part of the underfill resin 13 is formed on the upper surface 31A of the film state underfill resin 31. Accordingly, even in a case where the area of the opening part 25 of the solder resist layer 24 is large or the depth of the opening part 25 of the solder resist layer 24 is deep, it is possible to securely seal between the semiconductor element 12 and the wiring board 11 with the underfill resin 13.

In the first modified example of the manufacturing method of the semiconductor device 10 of the embodiment of the present invention, the same effect as that achieved by the manufacturing method of the semiconductor device 10 of the embodiment of the present invention (see FIG. 12 through FIG. 16) discussed above can be achieved.

In addition, in the first modified example of the manufacturing method of the semiconductor device 10 of the embodiment of the present invention, by the same step as those shown in FIG. 17 and FIG. 18, while the upper surface 12A of the semiconductor chip 12 is pressed at a substantially even pressure, the underfill resin base material 41 may be completely cured. In a case where the underfill resin base material 41 is thermosetting resin, while the surface 12A of the semiconductor chip 12 may be pressed and the underfill resin base material 41 may be heated, the underfill resin base material 41 may be completely cured so that the underfill resin 13 is formed.

In addition, in the first modified example of the manufacturing method of the semiconductor device 10 of the embodiment of the present invention, another film state underfill resin in the semi-cured state or the liquid state underfill resin 38 is formed only in the opening part 25 of the solder resist layer 24. The other film state underfill resin in the semi-cured state or the liquid state underfill resin 38 may be formed so as to cover the entirety of the upper surface 31A of the film state underfill resin 31.

Figure 24:
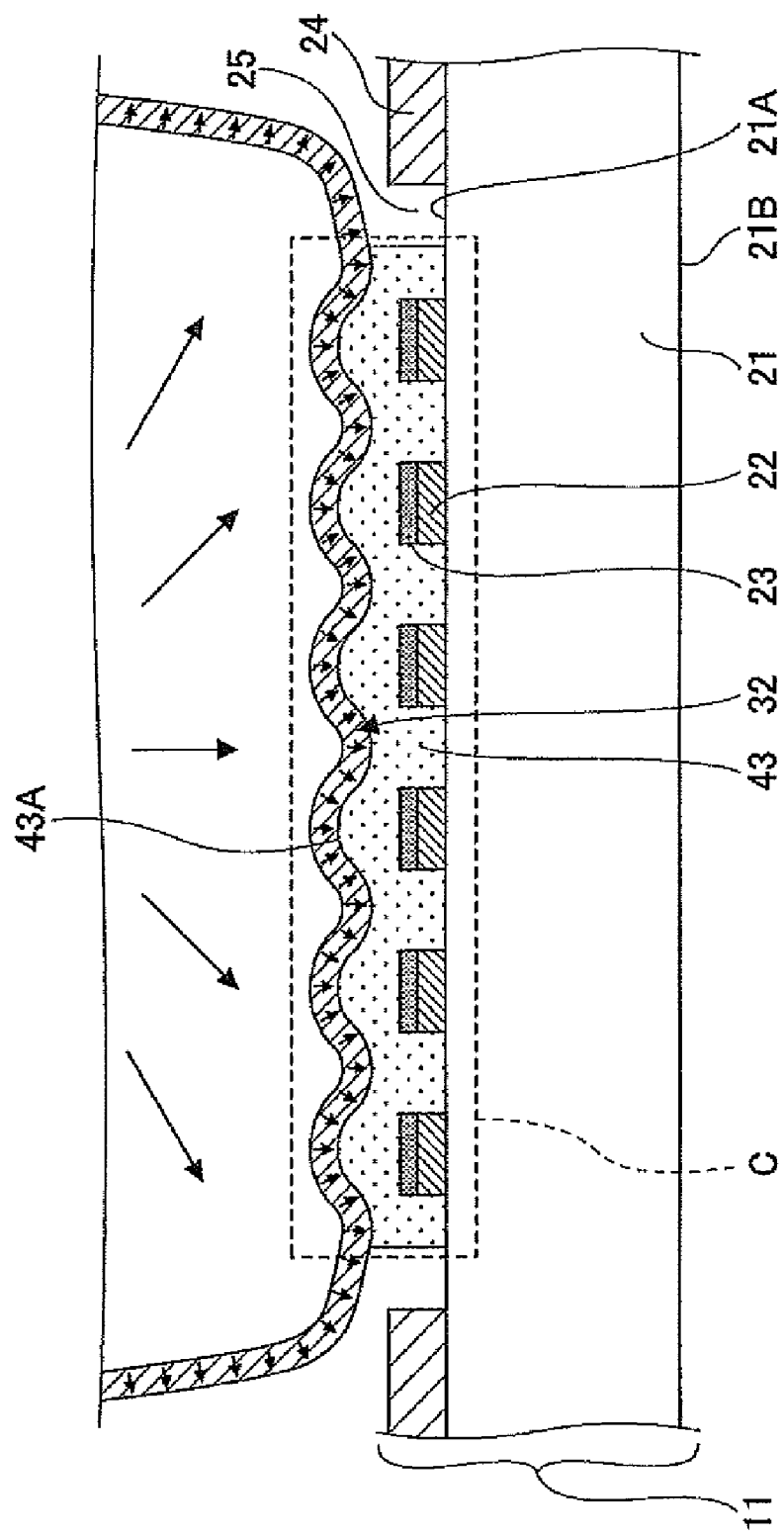
FIG. 24 is a first view showing a manufacturing process of a second modified example of the semiconductor device of the present invention.
Figure 27:
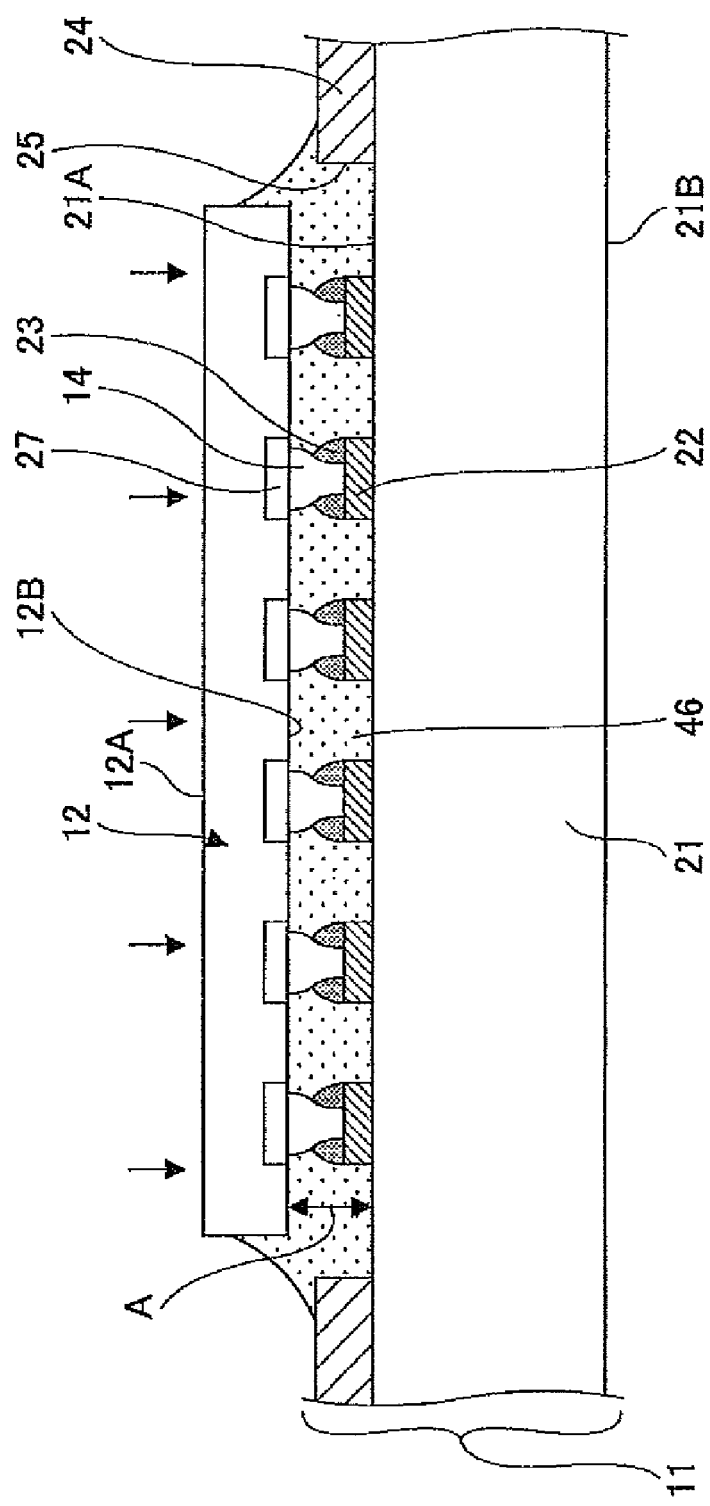
FIG. 27 is a fourth view showing the manufacturing process of the second modified example of the semiconductor device of the present invention.
Figure 28:
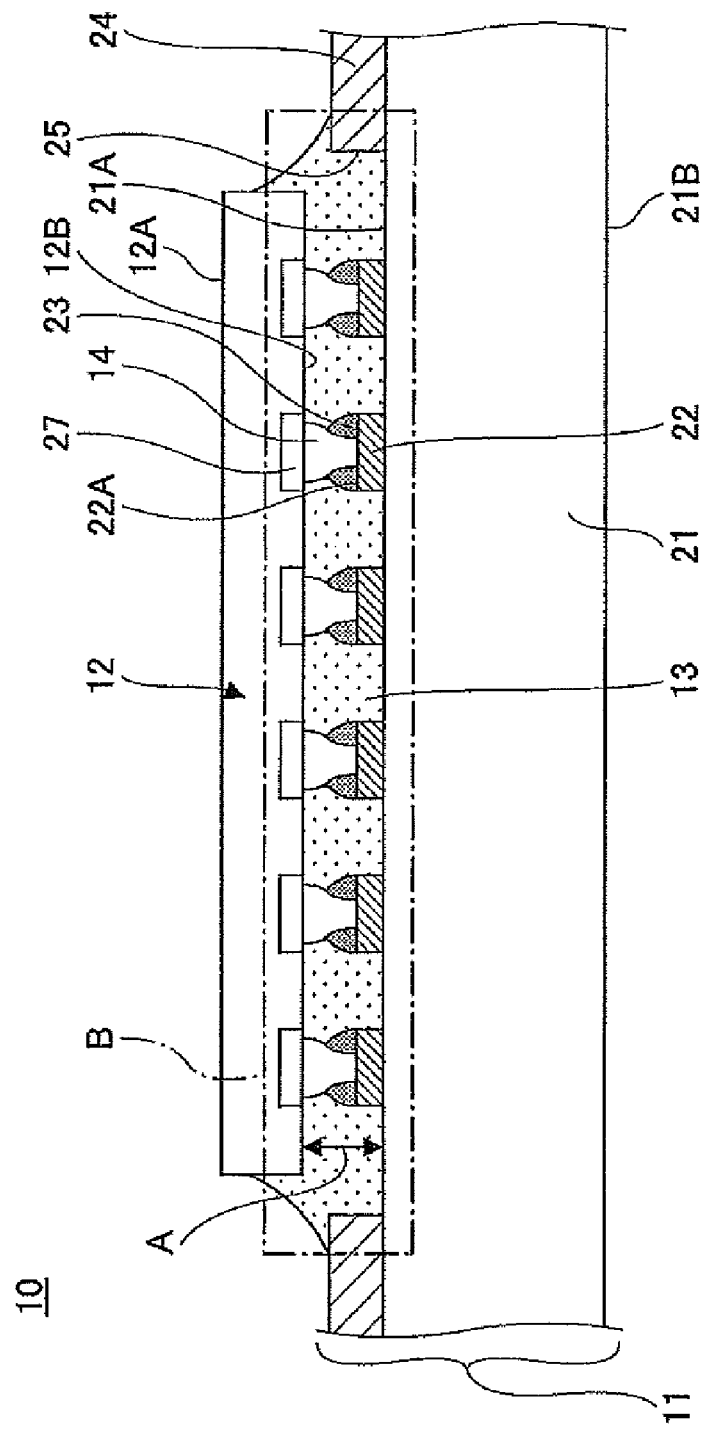
FIG. 28 is a fifth view showing the manufacturing process of the second modified example of the semiconductor device of the present invention.
Figure 29:
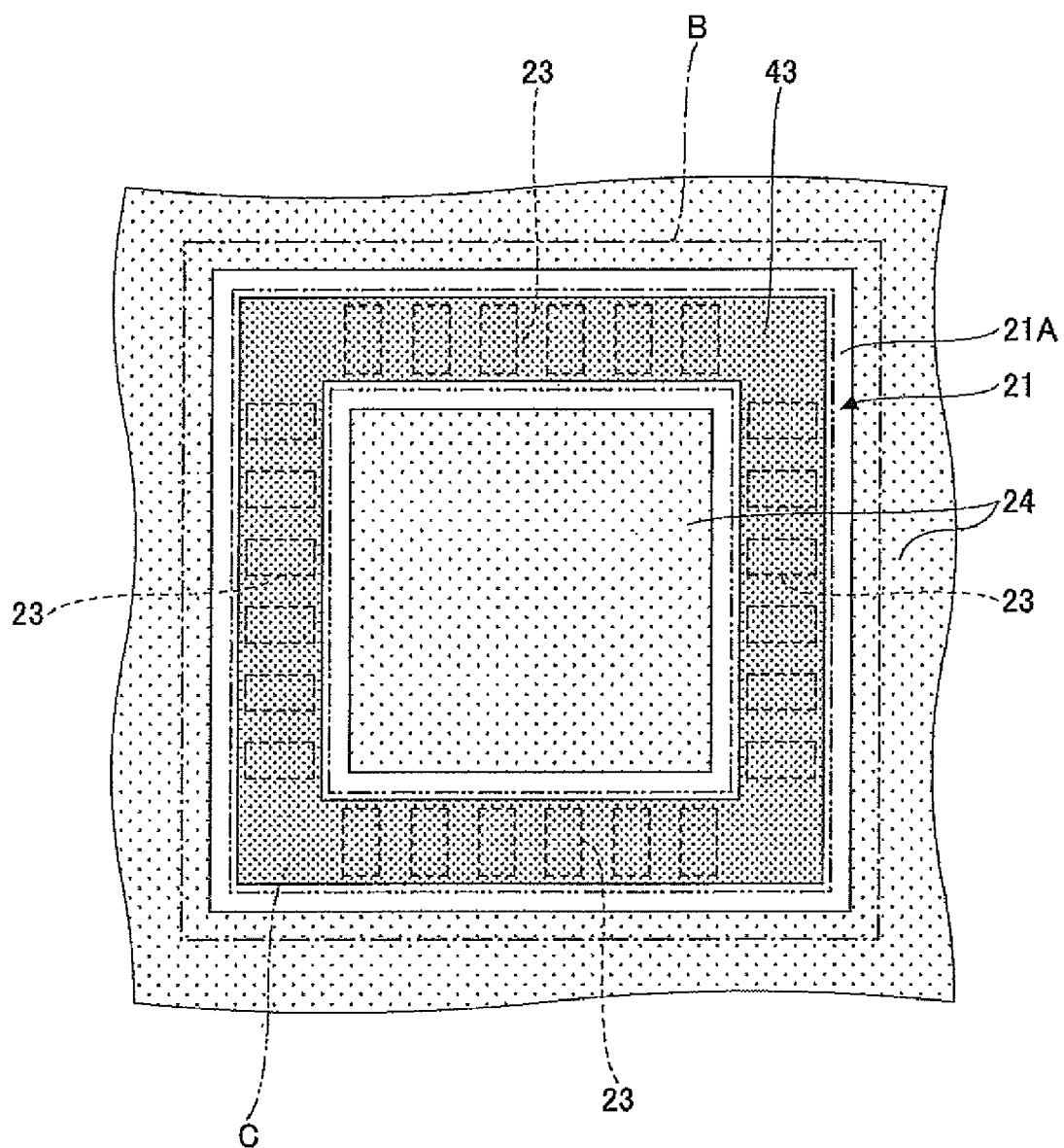
FIG. 29 is a view for explaining a forming area of a film state underfill resin formed on the wiring board.

FIG. 24 through FIG. 28 are views showing a manufacturing process of a second modified example of the semiconductor device of the present invention. FIG. 29 is a view for explaining a forming area of a film state underfill resin formed on the wiring board. In FIG. 24 through FIG. 29, parts that are the same as the parts of the semiconductor device 10 of FIG. 10 are given the same reference numerals, and explanation thereof is omitted. The reference letter "C" indicated in FIG. 24 and FIG. 29 represents a forming area of a film state underfill resin 43 (hereinafter film state underfill resin forming area C).

The second modified example of the manufacturing method of the semiconductor device 10 of the embodiment of the present invention is discussed with reference to FIG. 24 through FIG. 29. First, in the step shown in FIG. 24, the same step as that shown in FIG. 13 is performed. As a result of this, the film state underfill resin 43 in the semi-cured state is adhered so as to cover a part of the wiring board 11 corresponding to the film state underfill resin forming area C (more specifically, the pads 22, the solders 23, and the upper surface 21A of the board main body 21 corresponding to the film state underfill resin forming area C) and to prevent a gap from being formed between the film state underfill resin 43 and the wiring board 11. See FIG. 29. (film state underfill resin adhering step).

At this stage, as shown in FIG. 24, an upper surface 43A of the film state underfill resin 43 has a convexo-concave configuration. The underfill resin 43 becomes a part of a base material of the underfill resin 13. As a material of the film state underfill resin 43, for example, thermosetting resin (more specifically, for example, epoxy resin having thermosetting properties) can be used. The thickness of the underfill resin 43 may be set whereby the underfill resin 43 can be supplied into the opening part 25 of the solder resist layer 24 in a step discussed below with reference to FIG. 25. More specifically, the thickness of the underfill resin 43 may be, for example, approximately 10 μm through approximately 50 μm.

Figure 25:
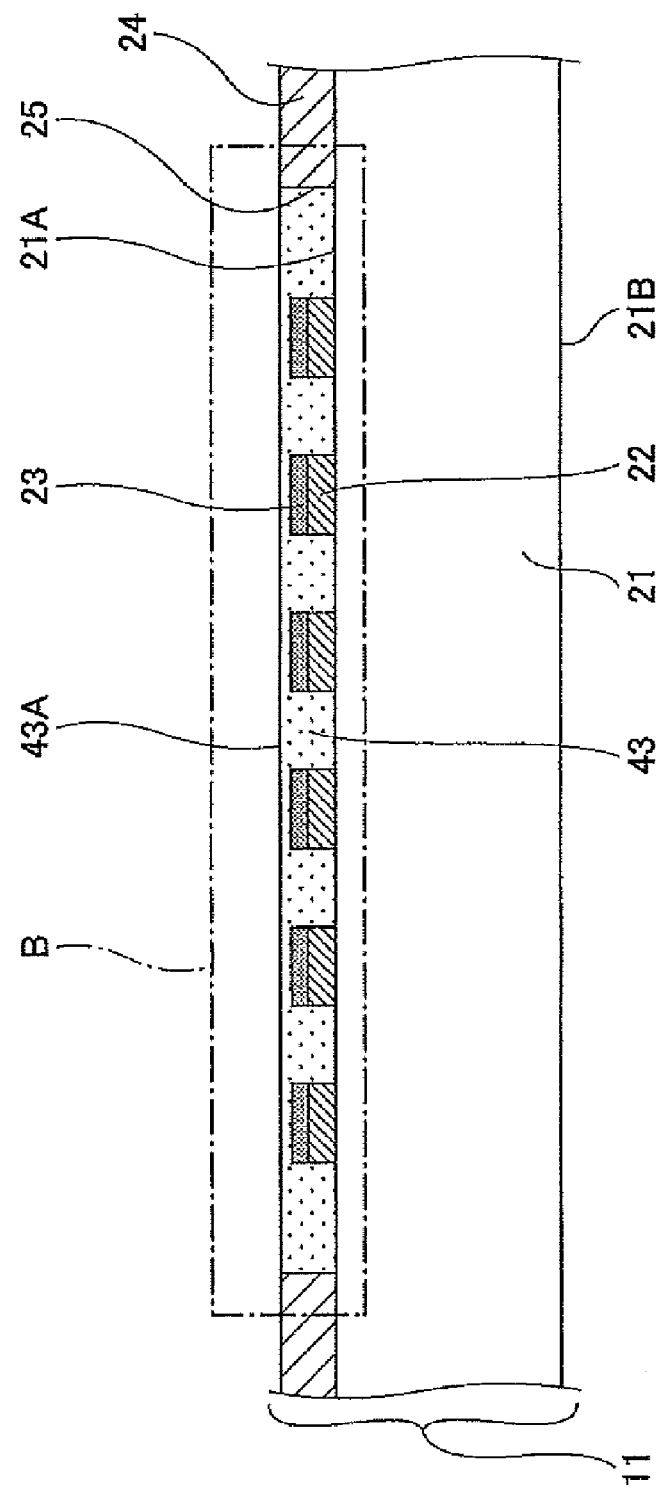
FIG. 25 is a second view showing the manufacturing process of the second modified example of the semiconductor device of the present invention.

Next, in a step shown in FIG. 25, by the same method as the step discussed with reference to FIG. 14, the upper surface 43A of the film state underfill resin 43 in the semi-cured state is made flat (flattening step). As a result of this, the upper surface 43A of the underfill resin 43 is made flat. At this time, the underfill resin 43 in the semi-cured state is pressed so that the opening part 25 of the solder resist layer 24 is completely filled with the underfill resin 43 in the semi-cured state. The flattening step may be performed so that the flat upper surface 43A of the underfill resin 43 is situated on the substantially same surface as the upper surface of the solder resist layer 25.

Thus, the film state underfill resin 43 is formed so as to cover a part of the wiring board 11 corresponding to the film state underfill resin forming area C. The underfill resin 43 in the semi-cured state is pressed so that the opening part 25 of the solder resist layer 24 is completely filled with the underfill resin 43 in the semi-cured state. As a result of this, it is possible to prevent the gap from being formed between the wiring board 11 and the underfill resin 43.

Figure 26:
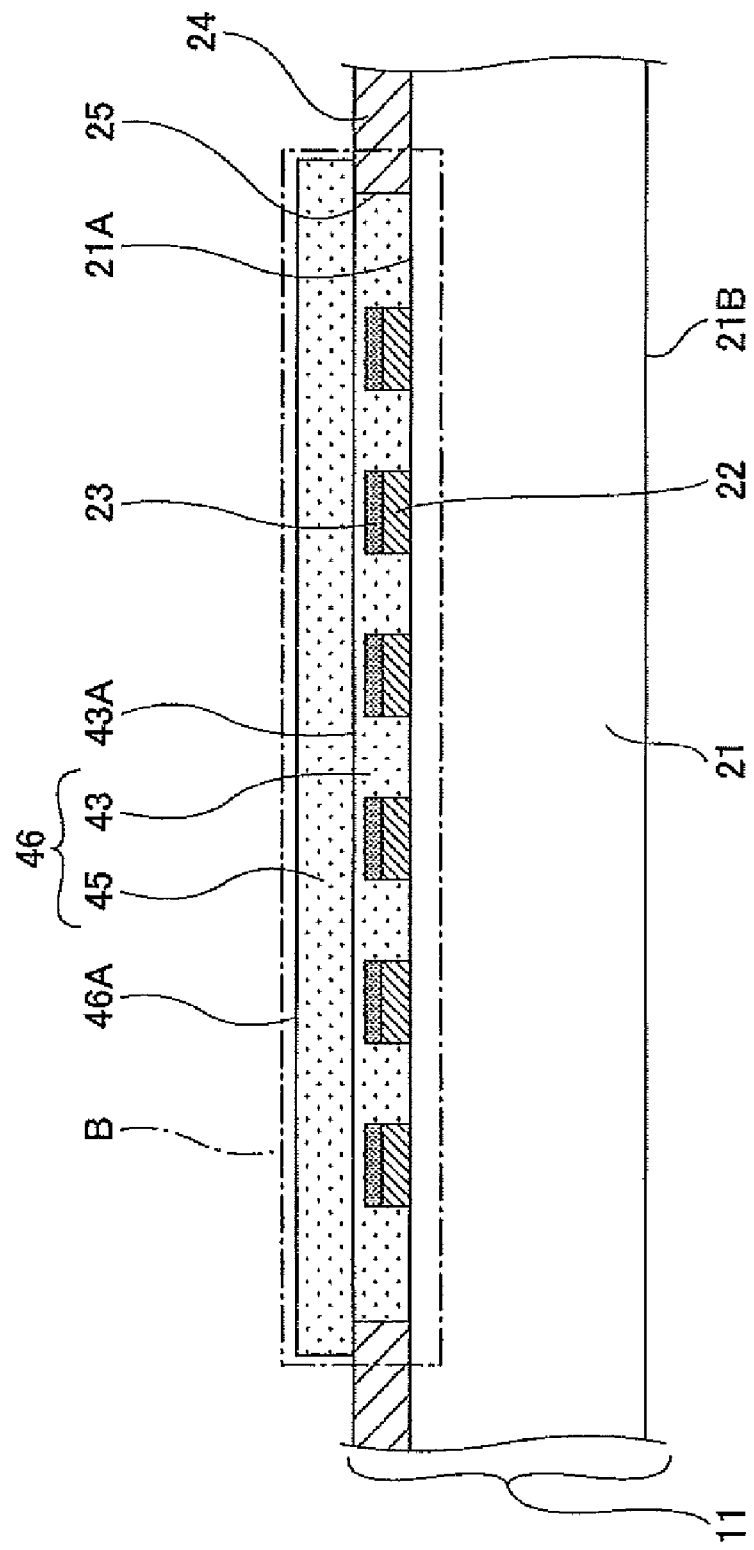
FIG. 26 is a third view showing the manufacturing process of the second modified example of the semiconductor device of the present invention.

Next, in a step shown in FIG. 26, the film state underfill resin 45 in the semi-cured state or the liquid state underfill resin (not shown) is formed so as to cover the upper surface 43A of the film state underfill resin 43 and the upper surface of a part of the solder resist layer 24 corresponding to the underfill resin forming area B. As a result of this, the underfill resin base material 46 made of the film state underfill resin 43 and the film state underfill resin 45 or the film state underfill resin 43 and the liquid state underfill resin is formed (underfill resin base material forming step). When the underfill resin base material 46 is completely cured, the material 46 becomes the underfill resin 13.

In the underfill resin base material forming step, for example, in a case where the film state underfill rein 45 is formed so as to cover the upper surface 43A of the film state underfill resin 43 and the upper surface of the part of the solder resist layer 24 corresponding to the underfill resin forming area B, another film state underfill resin 45 is formed by the same method as the step discussed with reference to FIG. 13. The same resin as the above-mentioned film state underfill resin 31 can be used as the film state underfill resin 45.

In the underfill resin base material forming step, for example, in the case where the liquid state underfill resin (not shown) is formed on the upper surface 43A of the film state underfill resin 43, the liquid state underfill resin is formed by application. As the liquid state underfill resin, for example, liquid state thermosetting resin (for example, thermosetting epoxy resin) can be used.

Thus, the film state underfill resin 45 in the semi-cured state or the liquid state underfill resin (not shown) is formed so as to cover the upper surface 43A of the film state underfill resin 43 and the upper surface of the part of the solder resist layer 24 corresponding to the underfill resin forming area B. Accordingly, even in a case where the area of the opening part 25 of the solder resist layer 24 is large or the depth of the opening part 25 of the solder resist layer 24 is deep, it is possible to securely seal between the semiconductor element 12 and the wiring board 11 with the underfill resin 13.

In the example shown in FIG. 26, the film state underfill resin 45 in the semi-cured state is formed so as to cover the upper surface 43A of the film state underfill resin 43 and the upper surface of the part of the solder resist layer 24 corresponding to the underfill resin forming area B.

Next, in a step shown in FIG. 27, the semiconductor chip 12 where the bumps 14 (for example, Au bumps) are provided on the electrode pads 27 is pressed from the upper surface (flat surface) 46A side of the underfill resin base material 46 in the semi-cured state shown in FIG. 26. The bumps 14 and the molten solders 23 come in contact with each other. In this case, the heating temperature when the solders 23 are melted is, for example, approximately 230° C. and the heating time is, for example, several seconds. As a result of this, the semiconductor chip 12 is flip chip connected to the pads 22 (chip connecting step). The gap A between the board main body 21 and the semiconductor chip 12 flip chip connected to the wiring board 11 may be, for example, approximately 5 μm through approximately 50 μm.

Next, in a step shown in FIG. 28, by the same method as the step discussed with reference to FIG. 16, the underfill resin base material 46 in the semi-cured state shown in FIG. 27 is completely cured so that the underfill resin 13 configured to seal between the semiconductor chip 12 and the wiring board 11 is formed (underfill resin forming step). As a result of this, the semiconductor device 10 of the embodiment of the present invention is manufactured.

In the underfill resin forming step, in a case where thermosetting resin (more specifically, for example, thermosetting epoxy resin) is used as a material of the underfill resin base material 46, the underfill resin base material 46 is heated for a designated time (for example, approximately 1 hour at approximately 150° C. through approximately 200° C.), and thereby the underfill resin 13 is formed.

Furthermore, in the underfill resin forming step, for example, the underfill resin base material 46 may be completely cured under the vacuum environment so that the underfill resin 13 can be formed. As a result of this, since gas, generated when the underfill resin base material 46 is cured, is discharged to the outside, it is possible to prevent voids from being generated in the underfill resin 13.

In the second modified example of the manufacturing method of the semiconductor device 10 of the embodiment of the present invention, the same effect as that achieved by the manufacturing method of the semiconductor device 10 of the embodiment of the present invention (see FIG. 12 through FIG. 16) discussed above can be achieved.

In addition, in the second modified example of the manufacturing method of the semiconductor device 10 of the embodiment of the present invention, by the same steps as those shown in FIG. 17 and FIG. 18, while the upper surface 12A of the semiconductor chip 12 is pressed at a substantially even pressure, the underfill resin base material 46 may be completely cured. In a case where the underfill resin base material 46 is thermosetting resin, while the surface 12A of the semiconductor chip 12 may pressed and the underfill resin base material 46 may be heated, the underfill resin base material 46 may be completely cured so that the underfill resin 13 is formed.

According to the above-discussed embodiments of the present invention, film state underfill resin in a semi-cured state is adhered on the first surface of the board main body without forming a gap between the first surface of the board main body and the pad; an upper surface of the underfill resin is flattened; and the semiconductor chip is pressed from the upper surface side of the underfill resin after the flattening step so that the semiconductor chip is flip chip connected to the pad.

Accordingly, it is possible to prevent air bubbles from being formed between the underfill resin and the board main body and the pads, inside the underfill resin, and between the semiconductor chip and the underfill resin. Because of this, since the air bubbles formed by curing the film state underfill resin are not generated in the underfill resin, it is possible to improve the yield rate of the semiconductor device.

According to the above-discussed embodiments of the present invention, film state underfill resin in a semi-cured state is adhered on the first surface of the board main body without forming a gap between the first surface of the board main body and the pad; an upper surface of the underfill resin is flattened; another film state underfill resin in a semi-cured state or liquid state underfill resin is formed on an upper surface of the underfill resin after the flattening step, so that an underfill resin base material made of the film state underfill resin and the other film state underfill resin or the film state underfill resin and the liquid state underfill resin is formed; and the semiconductor chip is pressed from the upper surface side of the underfill resin base material so that the semiconductor chip is flip chip connected to the pads.

Accordingly, it is possible to prevent air bubbles from being formed between the underfill resin base material and the board main body and the pads, inside the underfill resin base material, and between the semiconductor chip and the underfill resin base material. Because of this, since the air bubbles formed by curing the underfill resin base material are not generated in the underfill resin, it is possible to improve the manufacturing yield of the semiconductor device.

According to the above-discussed embodiments of the present invention, film state underfill resin in a semi-cured state is adhered on the first surface of the board main body without forming a gap between the first surface of the board main body and the pad; another film state underfill resin in a semi-cured state or liquid state underfill resin is formed on an upper surface of the film state underfill resin after the film state underfill resin adhering step, so that underfill resin base material made of the film state underfill resin and the other film state underfill resin or the film state underfill resin and the liquid state underfill resin is formed; and the semiconductor chip is pressed from the upper surface side of the underfill resin base material so that the semiconductor chip is flip chip connected to the pads.

Accordingly, it is possible to prevent air bubbles from being formed between the underfill resin base material and the board main body and the pads, inside the underfill resin base material, and between the semiconductor chip and the underfill resin base material. Because of this, since the air bubbles formed by curing the underfill resin base material are not generated in the underfill resin, it is possible to improve the manufacturing yield of the semiconductor device.

In the case where the film state underfill resin and another film state underfill resin are formed, a flattening step may be provided.

Thus, according to the embodiments of the present invention, it is possible to provide a manufacturing method of a semiconductor device whereby generation of voids is prevented so that the manufacturing yield of the semiconductor devices can be improved.

The embodiments of the present invention can be applied to a manufacturing method of a semiconductor device, the semiconductor device including a wiring board where a semiconductor chip is flip chip connected and underfill resin configured to seal between the semiconductor chip and the wiring board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a semiconductor device, the semiconductor device including,
    a semiconductor chip including a bump provided on the semiconductor chip;
    a wiring board including a board main body and a pad provided on a first surface of the board main body, the pad being located where the bump of the semiconductor chip is to be flip chip connected; and
    underfill resin configured to seal between the semiconductor chip and the wiring board,
    the method comprising:
    a film state underfill resin adhering step of adhering film state underfill resin in a semi-cured state to the first surface of the board main body without forming a void between the first surface of the board main body and the pad;
    a flattening step of pressing a flat plate onto an upper surface of the film state underfill resin to flatten the upper surface of the film state underfill resin;
    a chip connecting step of pressing the bump of the semiconductor chip onto the flattened upper surface of the film state underfill resin so that the bump of the semiconductor chip is flip chip connected to the pad of the wiring board; and
    an underfill resin forming step of curing the film state underfill resin so that the underfill resin is formed between the semiconductor chip and the wiring board,
    wherein the pad of the wiring board is fully covered by the film state underfill resin after the flattening step.

2. The manufacturing method of the semiconductor device as claimed in claim 1, wherein, in the film state underfill resin adhering step, the film state underfill resin is adhered under a vacuum environment by using a diaphragm type laminate apparatus.

3. The manufacturing method of the semiconductor device as claimed in claim 1, wherein the bump of the semiconductor chip is electrically connected to the pad; and in the underfill resin forming step, the film state underfill resin is cured while a surface of the semiconductor chip, opposite to the surface where the bump is provided, is pressed.

4. The manufacturing method of the semiconductor device as claimed in claim 1, wherein, in the underfill resin forming step, the film state underfill resin is cured under a vacuum environment.

5. The manufacturing method of the semiconductor device as claimed in claim 1, wherein the chip connecting step and the underfill resin forming step are concurrently performed.

* * * * *